(12) United States Patent
Ok et al.

(10) Patent No.: US 10,541,329 B2
(45) Date of Patent: Jan. 21, 2020

(54) BOOSTED VERTICAL FIELD-EFFECT TRANSISTOR

(71) Applicant: International Business Machines Corporation, Armonk, NY (US)

(72) Inventors: Injo Ok, Loudonville, NY (US); Choonghyun Lee, Rensselaer, NY (US); Soon-Cheon Seo, Glenmont, NY (US); Seyoung Kim, Weschester, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/918,800

(22) Filed: Mar. 12, 2018

(65) Prior Publication Data
US 2019/0280120 A1 Sep. 12, 2019

(51) Int. Cl.
*H01L 29/78* (2006.01)
*H01L 29/417* (2006.01)
(Continued)

(52) U.S. Cl.
CPC ...... *H01L 29/7827* (2013.01); *H01L 21/8249* (2013.01); *H01L 27/0623* (2013.01);
(Continued)

(58) Field of Classification Search
CPC ............. H01L 29/7827; H01L 29/0847; H01L 29/1027; H01L 29/41741; H01L 29/66272;
(Continued)

(56) References Cited

U.S. PATENT DOCUMENTS 7,700,449 B2 * 4/2010 Lee .................. H01L 21/82343
257/350
9,496,053 B2 * 11/2016 Han .................... G11C 11/4076
(Continued)

OTHER PUBLICATIONS

Han et al., "A CMOS-Compatible Boosted Transistor Having >2x Drive Current and Low Leakage Current," 46th European Solid-State Device Research Conference (ESSDERC), 2016, pp. 214-217, IEEE, 4 pages.
(Continued)

*Primary Examiner* — Victoria K. Hall
(74) *Attorney, Agent, or Firm* — Amin, Turocy & Watson, LLP

(57) ABSTRACT

Techniques related to a boosted vertical field effect transistor and method of fabricating the same are provided. A logic device can comprise a vertical field effect transistor comprising a substrate, a first epitaxial layer and a second epitaxial layer. A bottom source/drain contact can be between a top surface and the first epitaxial layer and a top source/drain contact can be between the top surface and the second epitaxial layer at respective first portions of one or more vertical fins. The logic device can also comprise a boosted bipolar junction transistor. A bipolar junction transistor contact can be between the top surface and the second epitaxial layer at respective second portions of the one or more vertical fins. The respective first portions and the respective second portions can be opposite portions of the one or more vertical fins.

20 Claims, 39 Drawing Sheets

(51) Int. Cl.

| | | |
|---|---|---|
| *H01L 29/732* | (2006.01) | |
| *H01L 29/08* | (2006.01) | |
| *H01L 29/10* | (2006.01) | |
| *H01L 29/45* | (2006.01) | |
| *H01L 29/66* | (2006.01) | |
| *H01L 21/8249* | (2006.01) | |
| *H01L 27/06* | (2006.01) | |
| *H01L 21/8238* | (2006.01) | |
| *H03K 19/0944* | (2006.01) | |
| *H01L 21/762* | (2006.01) | |
| *H01L 29/06* | (2006.01) | |
| *H01L 21/311* | (2006.01) | |
| *H01L 21/324* | (2006.01) | |
| *H01L 21/265* | (2006.01) | |

(52) U.S. Cl.
CPC ...... *H01L 29/0847* (2013.01); *H01L 29/1037* (2013.01); *H01L 29/41741* (2013.01); *H01L 29/456* (2013.01); *H01L 29/66272* (2013.01); *H01L 29/66666* (2013.01); *H01L 29/732* (2013.01); *H01L 21/26513* (2013.01); *H01L 21/31116* (2013.01); *H01L 21/324* (2013.01); *H01L 21/76224* (2013.01); *H01L 21/823814* (2013.01); *H01L 21/823828* (2013.01); *H01L 21/823878* (2013.01); *H01L 21/823885* (2013.01); *H01L 29/0649* (2013.01); *H01L 29/6653* (2013.01); *H03K 19/09448* (2013.01)

(58) Field of Classification Search
CPC ............... H01L 29/732; H01L 27/0623; H01L 21/8249; H03K 19/09448
See application file for complete search history.

(56) References Cited

U.S. PATENT DOCUMENTS

| | | | | |
|---|---|---|---|---|
| 9,502,883 | B2* | 11/2016 | Ahsan | H01L 27/027 |
| 10,002,797 | B1* | 6/2018 | Pandey | H01L 29/0657 |
| 2008/0258695 | A1* | 10/2008 | Kumar | H05B 33/0818 |
| | | | | 323/223 |
| 2015/0123246 | A1* | 5/2015 | Hu | H01L 21/8249 |
| | | | | 257/584 |
| 2015/0311342 | A1* | 10/2015 | Lin | H01L 29/7848 |
| | | | | 257/190 |
| 2018/0068998 | A1* | 3/2018 | Wang | H01L 27/0207 |
| 2019/0067461 | A1* | 2/2019 | Pan | H01L 29/7393 |

OTHER PUBLICATIONS

Patel et al., "Drive current boosting of n-type tunnel FET with strained SiGe layer at source," Microelectronics Journal, Dec. 2008, pp. 1671-1677, vol. 39, No. 12, Elsevier, 7 pages.

Saluru, "Projection of TaSiOx/In0.53Ga0.47As Tri-gate transistor performance for future Low-Power Electronic Application," Master's thesis at Virginia Polytechnic Institute and State University, May 2017, Blacksburg, Virginia, 125 pages.

Anonymous, "NEC Test-Produces World's Smallest Transistor," The Free Library, 2003, Kyodo News International, Inc., 1 page. https://www.thefreelibrary.com/NEC+test-produces+world%27s+smallest+transistor-a0111295563.

Magee, "IBM Claims World's Smallest Silicon Transistor," The Inquirer Newsletter, Dec. 2002, 1 page.

Anonymous, "Still Room at the Bottom," Apr. 2006, The Korea Advanced Institute of Science and Technology, 1 page. https://www.highbeam.com/doc/1G1-145838158.html.

Larrieu et al., "Vertical Field effect transistor with sub-15nm gate-all-around on Si nanowire array," 45th European Solid State Device Research Conference (ESSDERC), 2015, pp. 202-205, IEEE, 4 pages.

Lapedus, "5nm Fab Challenges," Manufacturing & Process Technology, Jan. 2016, 6 pages. http://semiengineering.com/category-main-page-manufacturing/.

Armasu, "Samsung Reveals 4nm Process Generation, Full Foundry Roadmap," Samsung News, May 2017, 3 pages. http://www.tomshardware.com/news/samsung-4nm-foundry-roadmap-revealed,34515.html.

\* cited by examiner

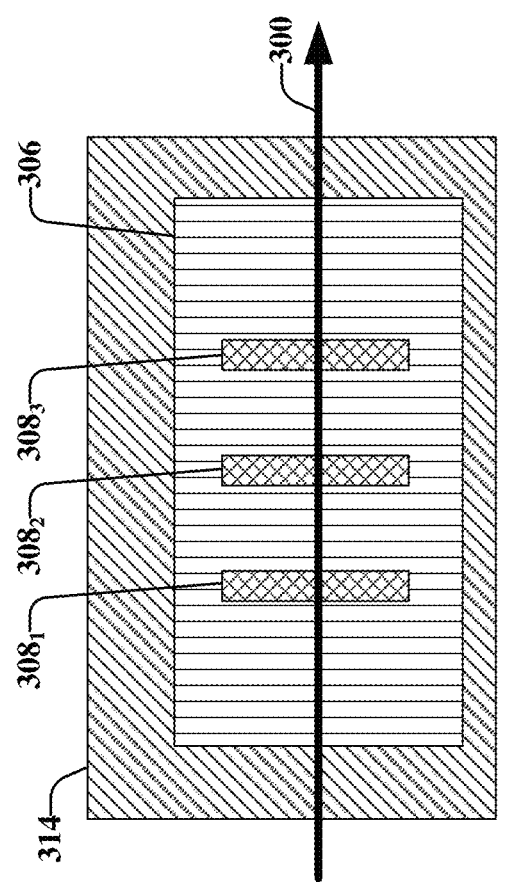

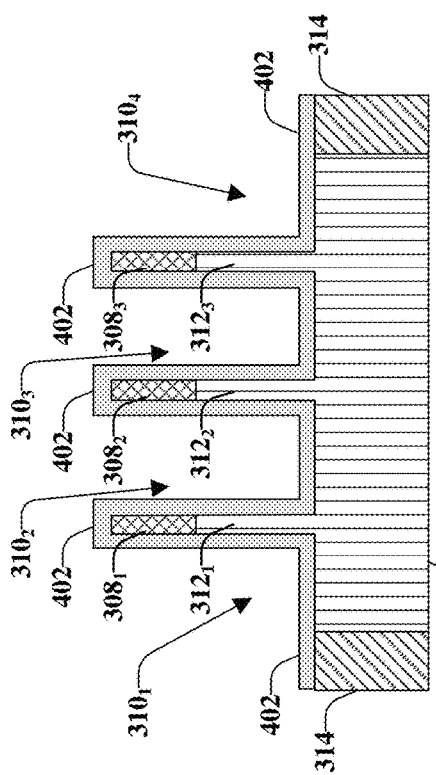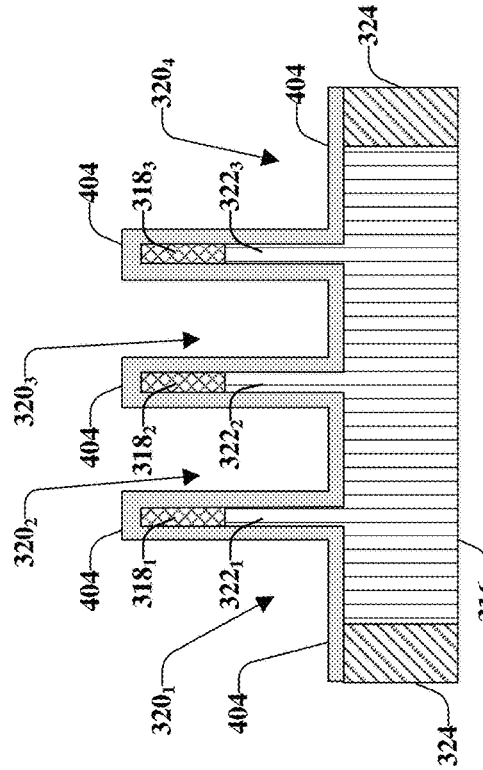
FIG. 4B
FIG. 4C

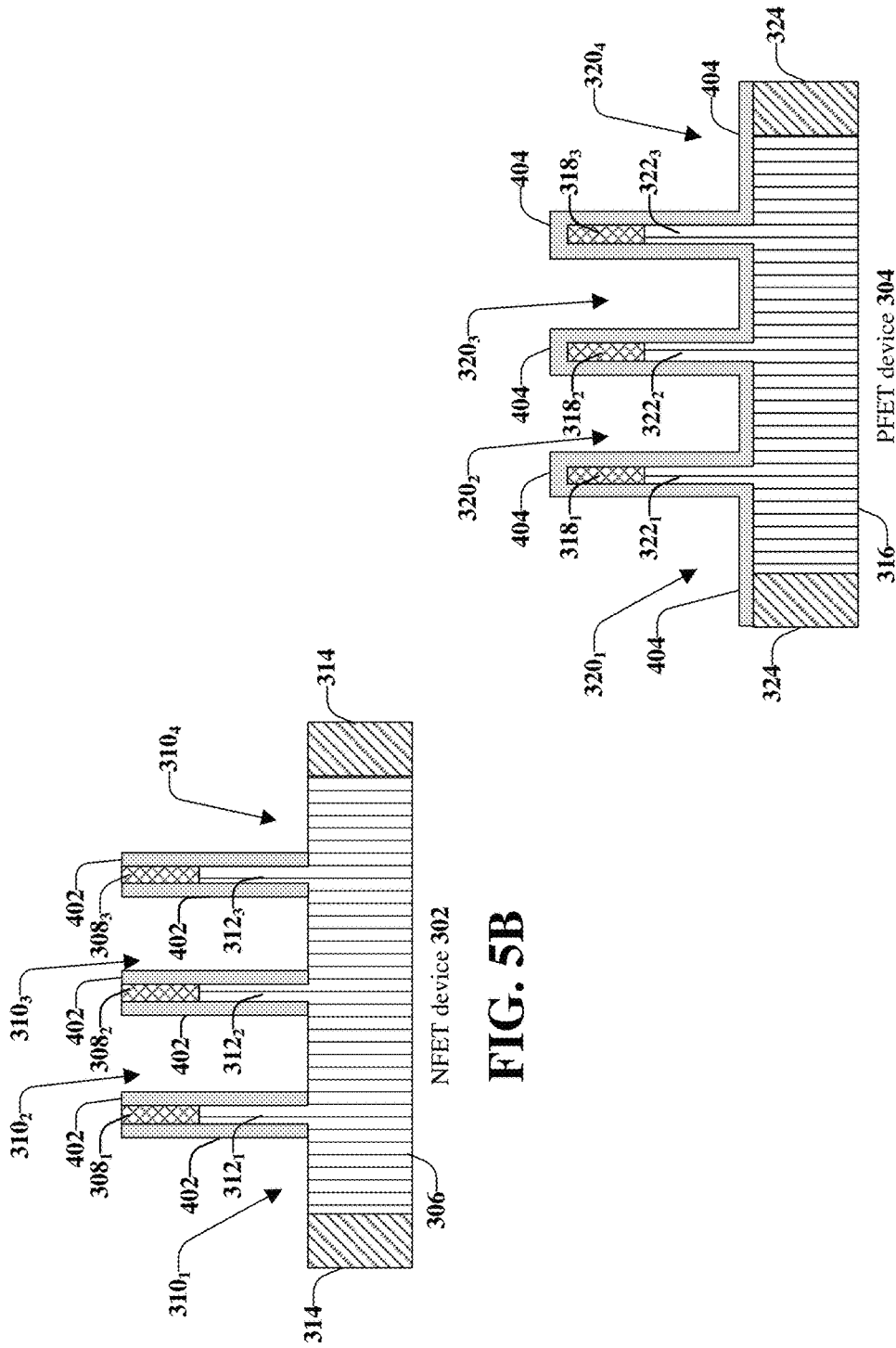

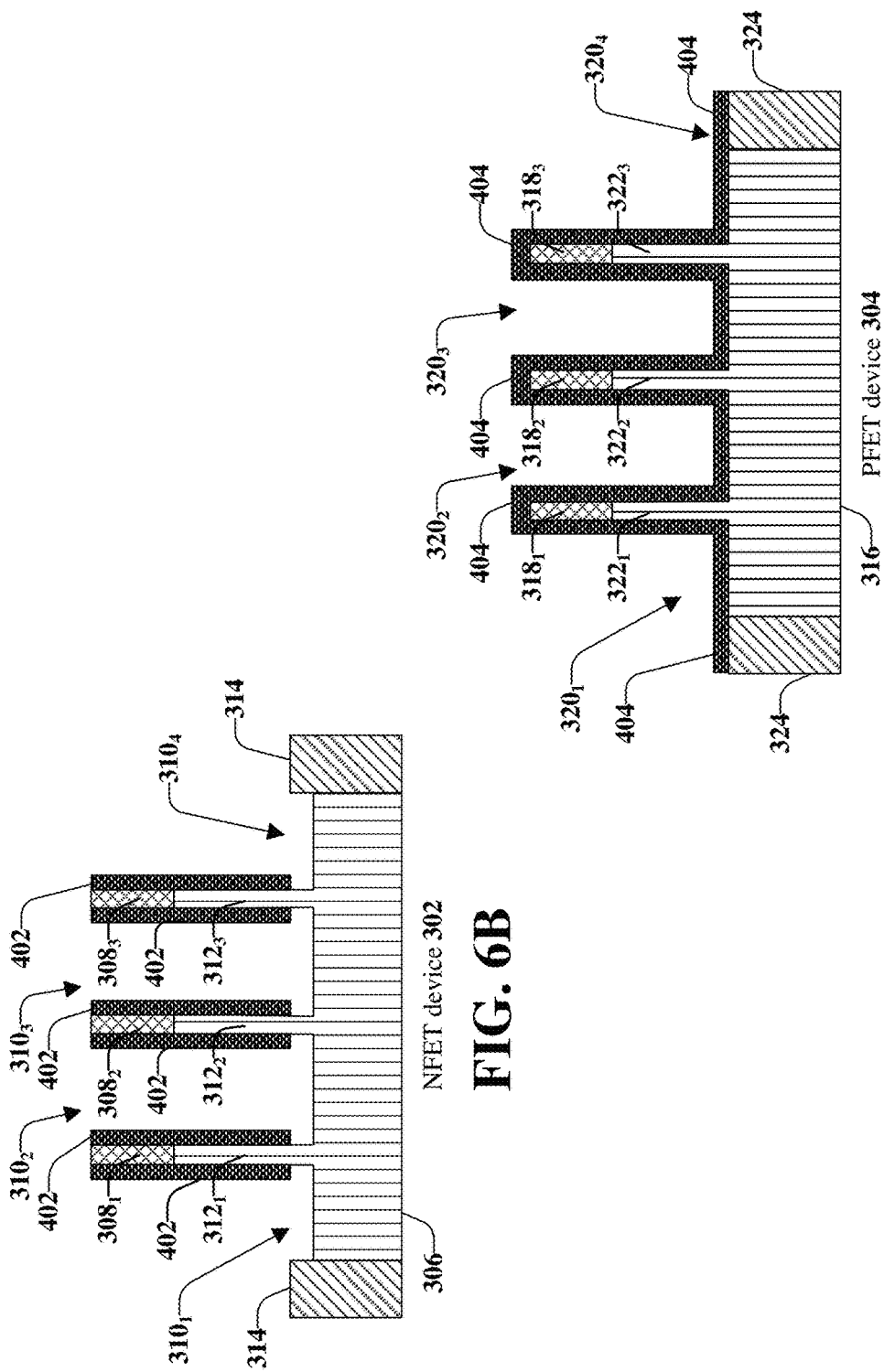

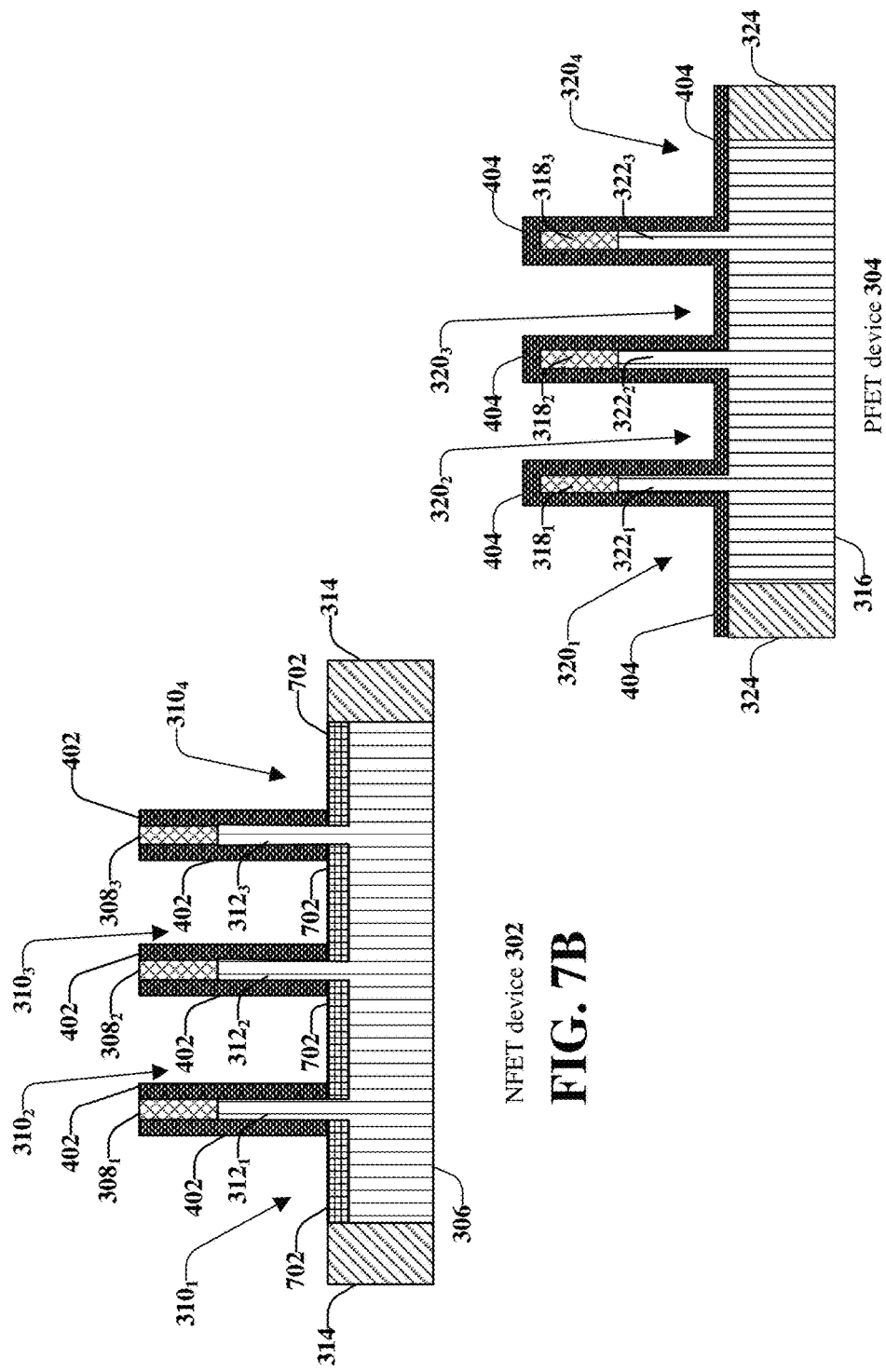

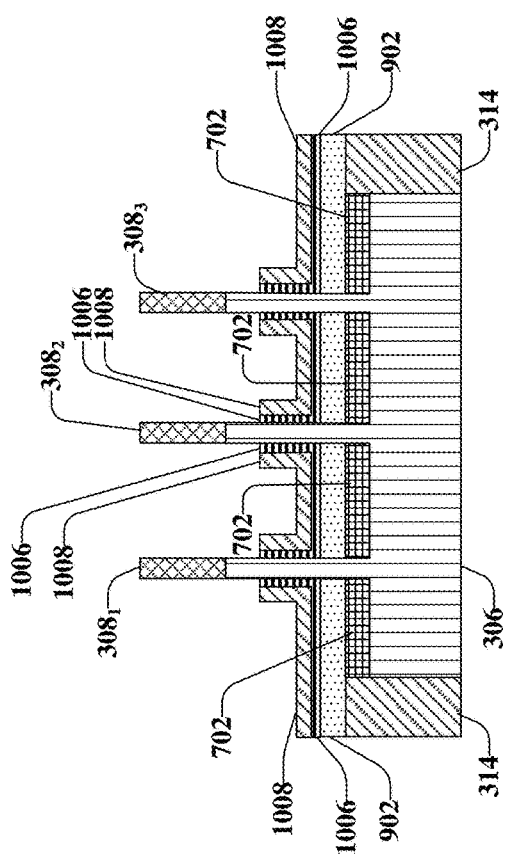
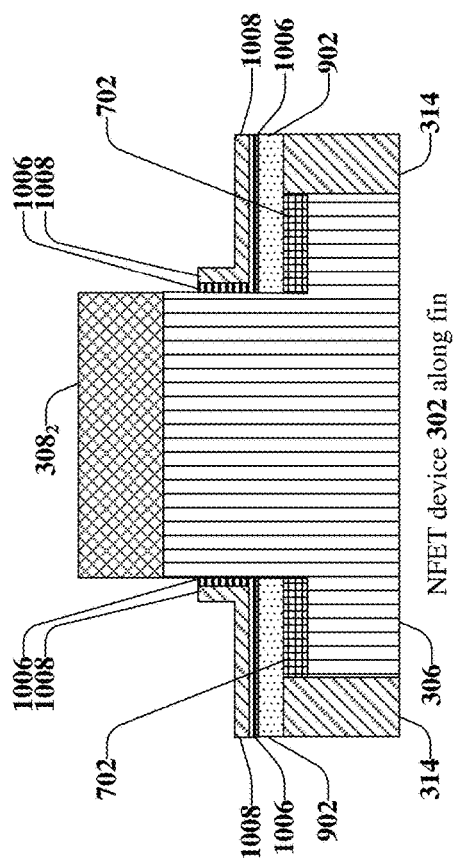
FIG. 10B
FIG. 10C

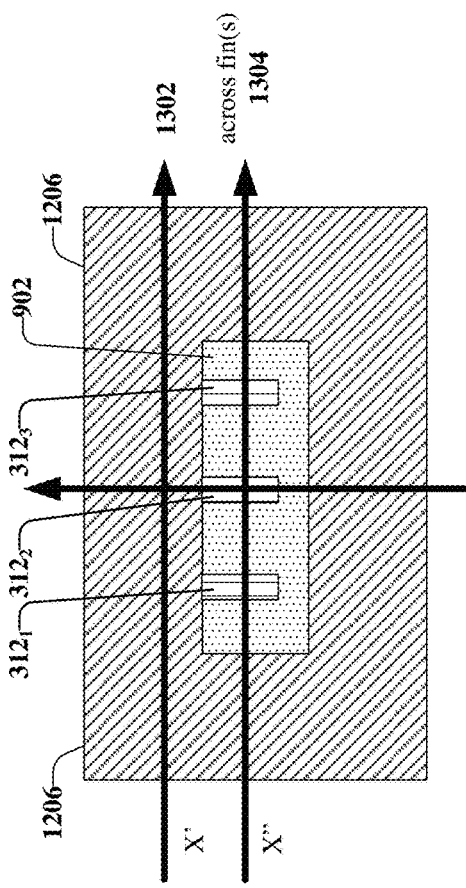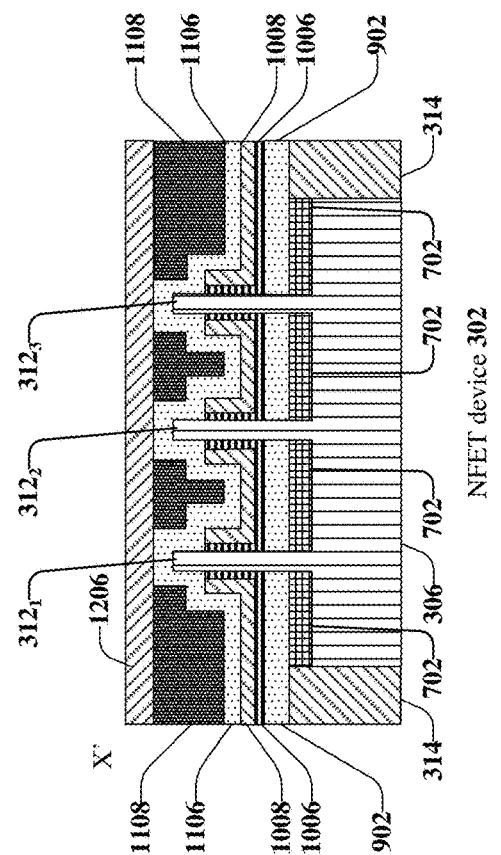
FIG. 13A
FIG. 13B

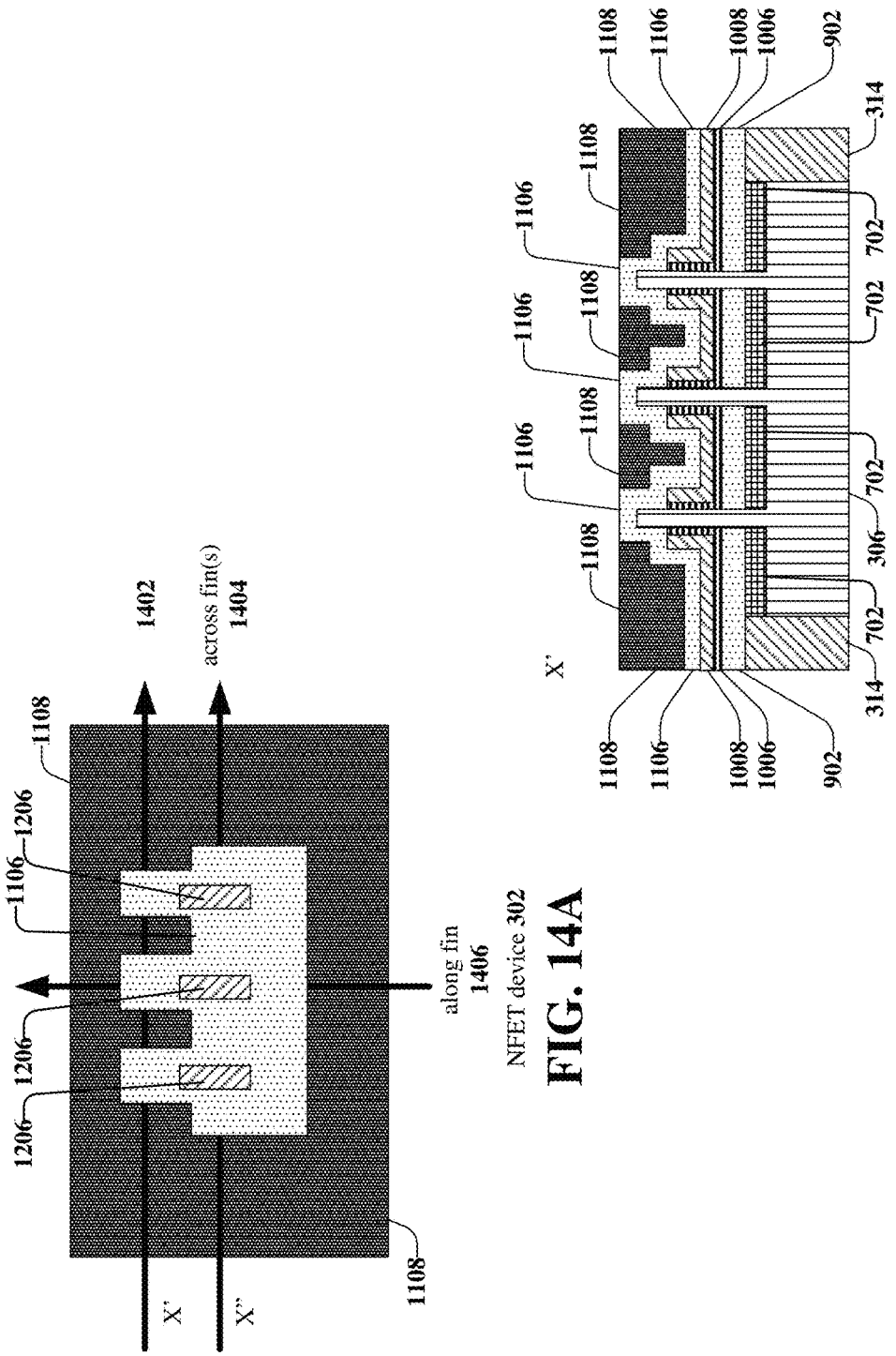

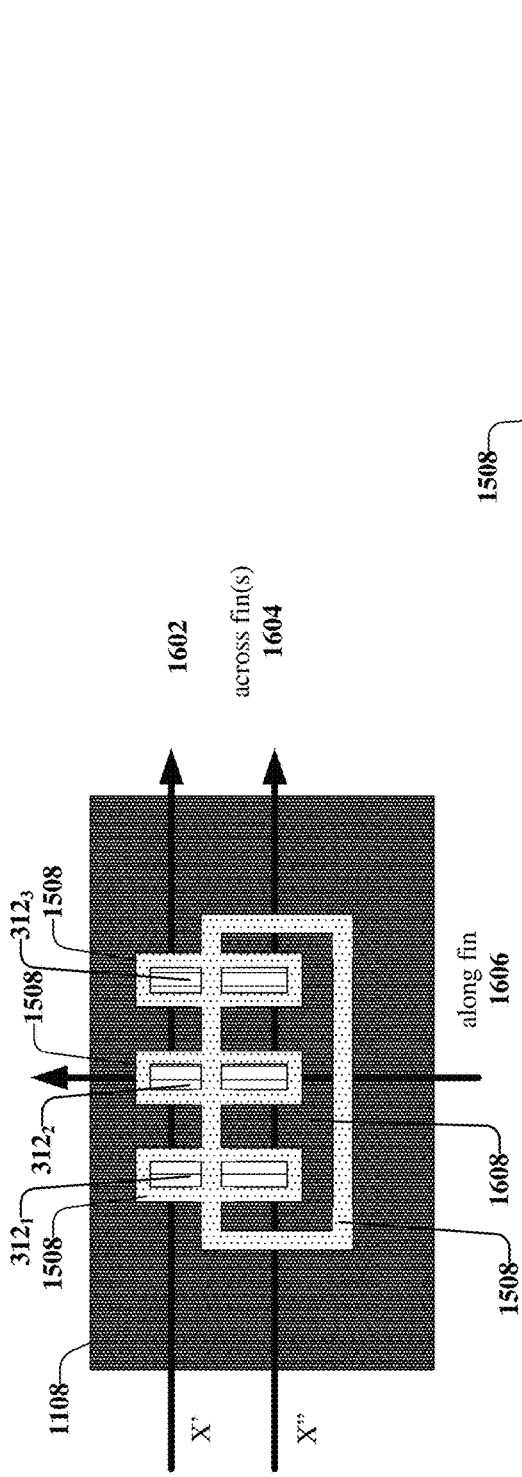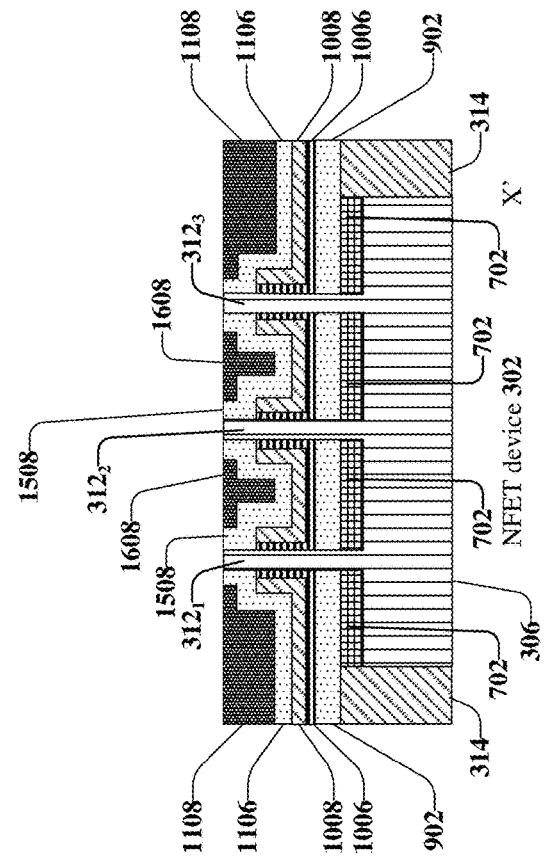

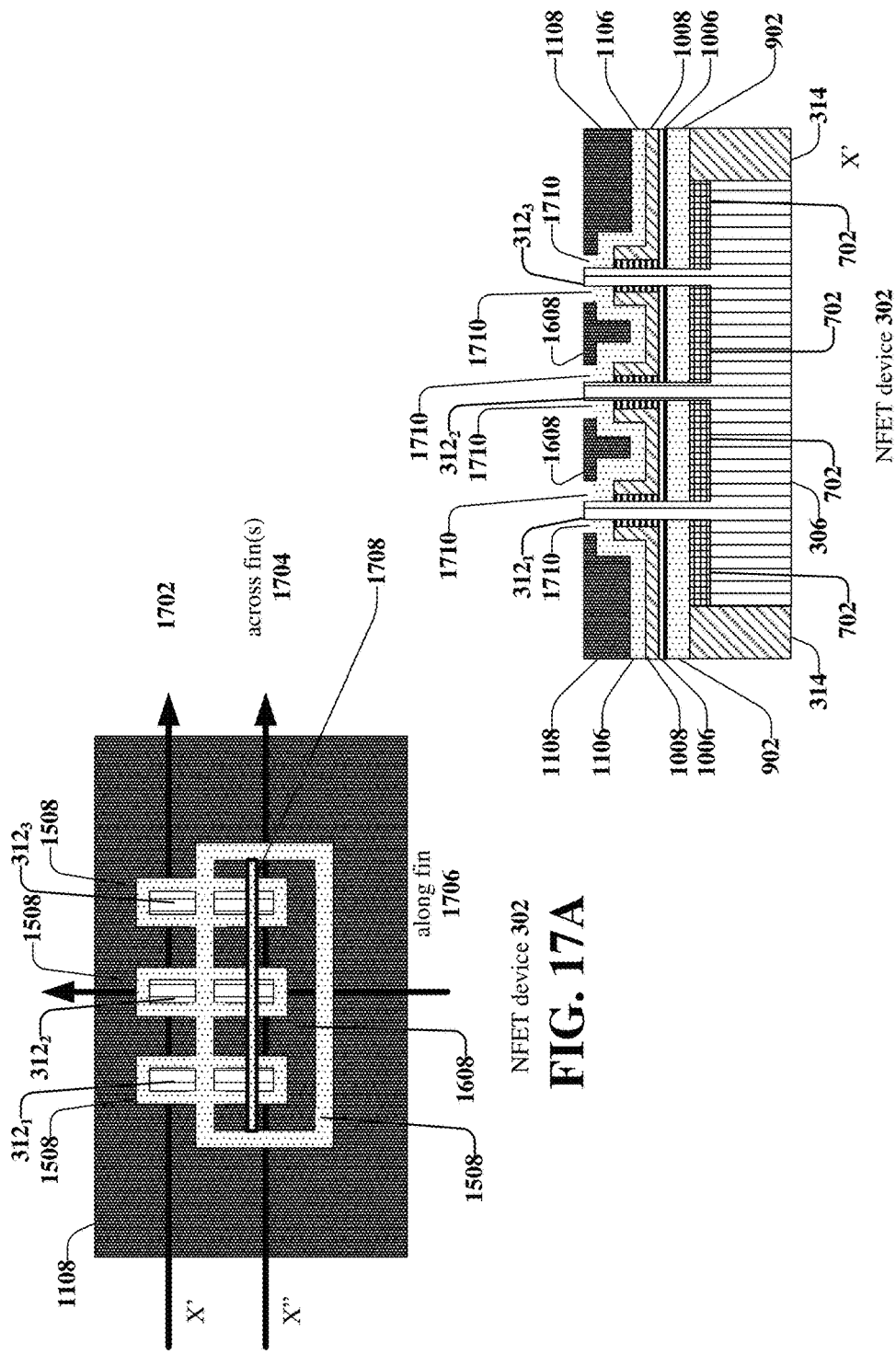

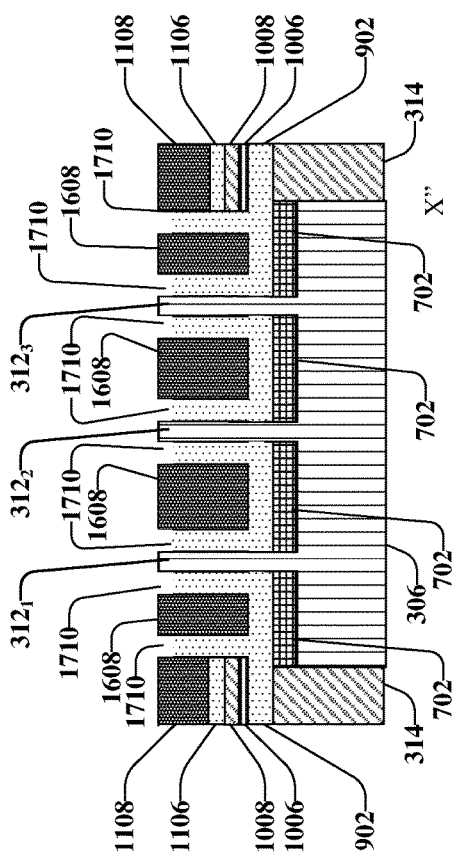
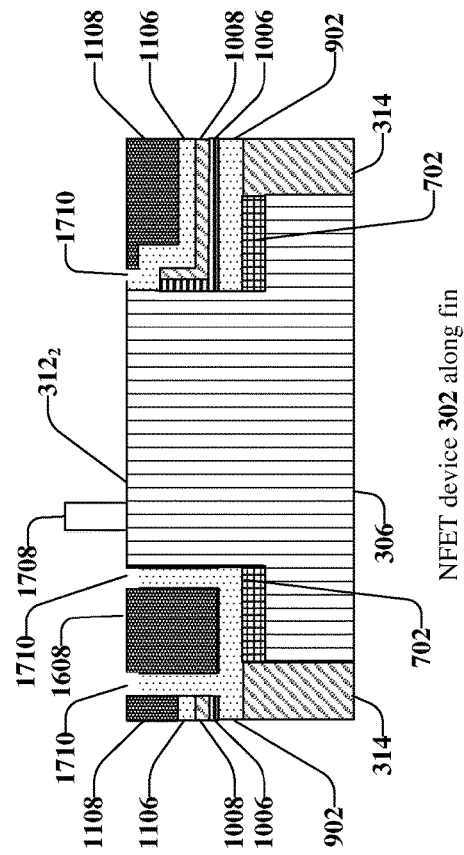
FIG. 17C
FIG. 17D

BOOSTED VERTICAL FIELD-EFFECT TRANSISTOR

BACKGROUND

The subject invention relates to semiconductor devices, and more specifically, vertical field-effect transistors and methods of fabricating the same.

SUMMARY

The following presents a summary to provide a basic understanding of one or more embodiments of the invention. This summary is not intended to identify key or critical elements or delineate any scope of the particular embodiments or any scope of the claims. Its sole purpose is to present concepts in a simplified form as a prelude to the more detailed description that is presented later. In one or more embodiments described herein, systems, computer-implemented methods, methods, apparatuses, devices, and/or computer program products that facilitate boosted vertical field-effect transistors are provided.

According to an embodiment, a logic device comprises a vertical field effect transistor comprising a substrate, a first epitaxial layer and a second epitaxial layer. A bottom source/drain contact can be between a top surface and the first epitaxial layer and a top source/drain contact can be between the top surface and the second epitaxial layer at respective first portions of one or more vertical fins. The logic device can also comprise a boosted bipolar junction transistor. A bipolar junction transistor contact can be between the top surface and the second epitaxial layer at respective second portions of the one or more vertical fins. The respective first portions and the respective second portions can be opposite portions of the one or more vertical fins.

According to another embodiment, a method can comprise forming a vertical field effect transistor over a substrate. The vertical field effect transistor can comprise a first epitaxial layer, a second epitaxial layer and one or more vertical fins. The method can also comprise forming a bottom source/drain contact between a top surface and the first epitaxial layer and a top source/drain contact between the top surface and the second epitaxial layer at respective first portions of the one or more vertical fins. Further, the method can comprise forming a bipolar junction transistor contact between the top surface and the second epitaxial layer at respective second portions of the one or more vertical fins. The respective first portions and the respective second portions can be opposite portions of the one or more vertical fins.

According to a further embodiment, a semiconductor device can comprise a vertical field effect transistor comprising a substrate, a first epitaxial layer, and a second epitaxial layer. A bottom source/drain contact can be between a top surface and the first epitaxial layer and a top source/drain contact can be between the top surface and the second epitaxial layer at respective first portions of one or more vertical fins. The semiconductor device can also comprise a boosted bipolar junction transistor. A bipolar junction transistor contact can be between the top surface and the second epitaxial layer at respective second portions of the one or more vertical fins. Further, the respective first portions and the respective second portions are opposite portions of the one or more vertical fins.

DESCRIPTION OF THE DRAWINGS

FIG. 3A illustrates a top down view of an n-channel field effect transistor device of the vertical field-effect transistor structure during a fabrication process wherein one or more fins are formed in accordance with one or more embodiments described herein.

FIG. 4B illustrates a side-cross sectional view of the n-channel field effect transistor device of FIG. 4A in accordance with one or more embodiments described herein.

FIG. 4C illustrates a cross-sectional view of the p-channel field effect transistor device during a fabrication process wherein a spacer is deposited over and adjacent portions of the p-channel field effect transistor device in accordance with one or more embodiments described herein.

FIG. 5B illustrates a side cross-sectional view of the n-channel field effect transistor device of FIG. 5A in accordance with one or more embodiments described herein.

FIG. 5C illustrates the p-channel field effect transistor device during removal of spacer portions from the n-channel field effect transistor device (as well as one or more subsequent portions of the fabrication process) in accordance with one or more embodiments described herein.

FIG. 6B illustrates a side view of the n-channel field effect transistor device of FIG. 6A in accordance with one or more embodiments described herein.

FIG. 6C illustrates the p-channel field effect transistor device during fabrication of the n-channel field effect transistor device according to FIGS. 6A and 6B in accordance with one or more embodiments described herein.

FIG. 7B illustrates a side cross-sectional view of the n-channel field effect transistor device of FIG. 7A in accordance with one or more embodiments described herein.

FIG. 7C illustrates the p-channel field effect transistor device during fabrication of the n-channel field effect transistor device according to FIGS. 7A and 7B in accordance with one or more embodiments described herein.

FIG. 10B illustrates a side cross-sectional view of the n-channel field effect transistor device of FIG. 10A in accordance with one or more embodiments described herein.

FIG. 10C illustrates another side cross-sectional view of the n-channel field effect transistor device of FIG. 10A in accordance with one or more embodiments described herein.

FIG. 13A illustrates a top down view of the n-channel field effect transistor device during a portion of the fabrication process wherein one or more layers are removed in accordance with one or more embodiments described herein.

FIG. 13B illustrates a side cross-sectional view of the n-channel field effect transistor device of FIG. 13A in accordance with one or more embodiments described herein.

FIG. 14A illustrates a top down view of the n-channel field effect transistor device during a portion of the fabrication process wherein a mask and a photoresist coating can be removed in accordance with one or more embodiments described herein.

FIG. 14B illustrates a side cross-sectional view of the n-channel field effect transistor device of FIG. 14A in accordance with one or more embodiments described herein.

FIG. 16A illustrates a top down view of the n-channel field effect transistor device during a portion of the fabrication process wherein oxide deposition and a chemical mechanical polishing/planarization (CMP) process are performed in accordance with one or more embodiments described herein.

FIG. 16B illustrates a side cross-sectional view of the n-channel field effect transistor device of FIG. 16A in accordance with one or more embodiments described herein.

FIG. 17A illustrates a top down view of the n-channel field effect transistor device during a portion of the fabrication process wherein top portions of the one or more fins are revealed in accordance with one or more embodiments described herein.

FIG. 17B illustrates a side cross-sectional view of the n-channel field effect transistor device of FIG. 17A in accordance with one or more embodiments described herein.

FIG. 17C illustrates another side cross-sectional view of the n-channel field effect transistor device of FIG. 17A in accordance with one or more embodiments described herein.

FIG. 17D illustrates a further side cross-sectional view of the n-channel field effect transistor device of FIG. 17A in accordance with one or more embodiments described herein.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Provided herein is a vertical field effect transistor (VFET) that can be fabricated in 5 nanometer (nm) VFET technology. The VFET can comprise a boosted semiconductor structure. According to an implementation, the boosted semiconductor structure can be a metal oxide semiconductor (MOS) structure. The various aspects can provide a steep slope (e.g., current-voltage characteristic) and high drive current boosting while maintaining low-off-state current as compared to MOS devices and/or symmetric metal oxide semiconductor (sMOS) devices.

Figure 1:
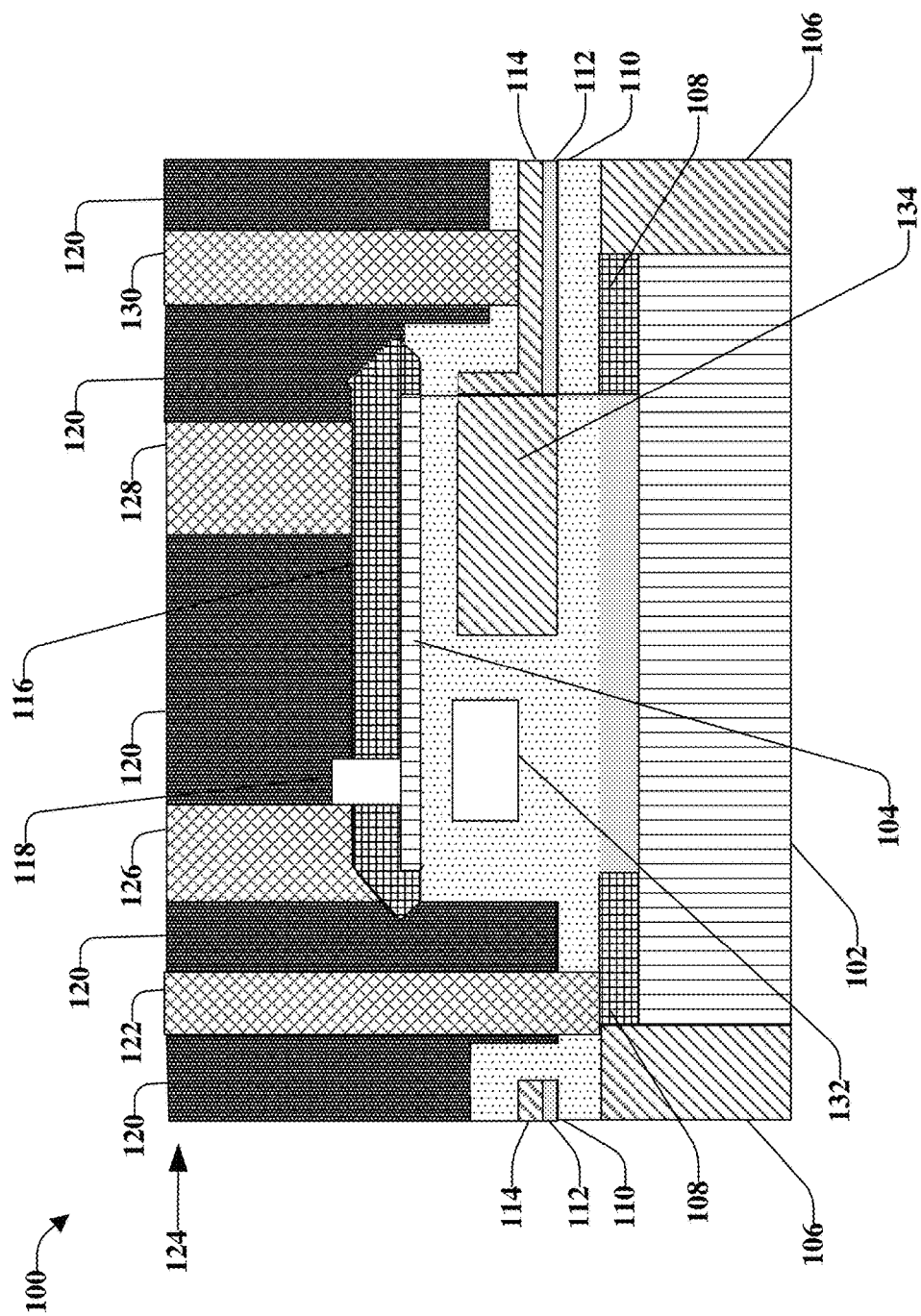
FIG. 1 illustrates an example, non-limiting side cross-sectional view of a structure for a vertical field-effect transistor device in accordance with one or more embodiments described herein.

FIG. 1 illustrates an example, non-limiting side cross-sectional view of a structure for a vertical field-effect transistor (VFET) device 100 in accordance with one or more embodiments described herein. The device 100 can be a boosted MOS structure that can be fabricated in 5 nm VFET technology, for example.

The device 100 can comprise an active area 102 formed on a substrate. According to an implementation, the active area 102 can be a bottom drain region. The active layer can be N++ doped. However, in other implementations, the active layer can be P++ doped.

Material used for the active layer can vary. According to an aspect, the active area 102 can comprise Indium Gallium Arsenide (InGaAs), Gallium Arsenide (GaAs), Indium Phosphide (InP), silicon-germanium (SiGe), another material, or combinations thereof. In an aspect, the substrate can comprise a silicon wafer. According to another aspect, the device 100 can comprise silicon dioxide on top of a silicon wafer. In another aspect, the substrate can comprise InGaAs, GaAs, InP, SiGe, or combinations thereof.

Further, a shallow trench isolation region 106 can be formed around the active area 102. In addition, a first epitaxial layer 108 can be grown on the active area 102. A high-density plasma layer or HDP layer 110 (e.g., a HDP bottom spacer) can be deposited on the first epitaxial layer 108. On the HDP layer 110 a high k dielectric and work function metal (WFM) layer (e.g., a HiK/WFM layer 112) and a spacer 114 can be deposited. Thereafter, a second epitaxial layer 116 can be grown over one or more fins 104.

Further, a layer of silicon nitride 118 can be deposited. The layer of silicon nitride 118 can provide a separation between the vertical FINFet device and a bipolar junction transistor (BJT). One or more layers of oxide 120 can be deposited over and adjacent the spacer 114 and the second epitaxial layer 116.

A first contact 122 can be formed between a top surface 124 of the device 100 and the first epitaxial layer 108. The first contact 122 can be a bottom source drain contact. A second contact 126 can be formed between the top surface 124 and the second epitaxial layer 116. The second contact 126 can be a Vbb-bipolar junction transistor (BJT) contact. According to an implementation, the voltage at the second contact 126 can be around 1.2 volts. The second contact 126 can be formed at a first area of the one or more fins 104.

A third contact 128 can be formed between the top surface 124 and the second epitaxial layer 116. The third contact can be a top source contact. The third contact 128 can be formed at a second area of the one or more fins 104. As illustrated, the first area of the one or more fins 104 can be opposite the second area of the one or more fins 104. A fourth contact 130 can be formed between the top surface 124 and the HiK/WFM layer 112. The fourth contact 130 can be a gate contact (Vg), according to an implementation.

According to an implementation, the second contact 126 can represent the collector of the device 100. The third contact 128 can represent the emitter of the device 100. Further, the base 132 of the device 100 can be adjacent the gate 134. The portion of the HDP layer 110 under the base 132 and the gate 134 represents the side spacer and the portion of the HDP layer 110 (under the fourth contact 130 represents the bottom spacer. Further details related to the device 100 and method of fabricating the same will be discussed below with respect to FIGS. 3A to 19D.

Figure 2:
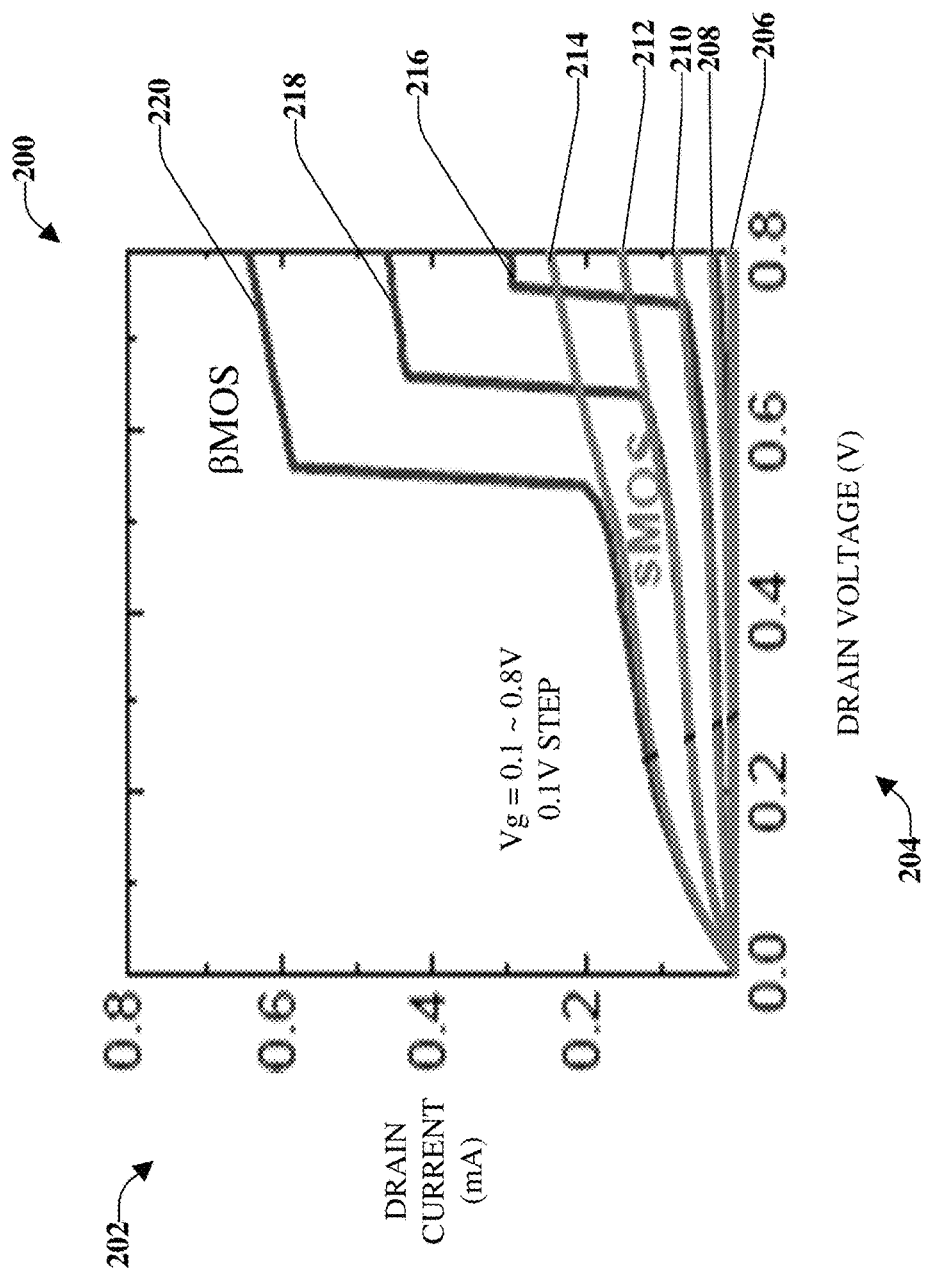
FIG. 2 illustrates an example, non-limiting, chart of a drain current compared to a drain voltage behavior in accordance with one or more embodiments described herein.

FIG. 2 illustrates an example, non-limiting, chart 200 of a drain current compared to a drain voltage behavior in accordance with one or more embodiments described herein. Illustrated on the vertical (Y) axis is drain current 202, in milliamps (mA). Illustrated on the horizontal (X) axis is drain voltage 204.

Respective drain currents (Ids) and respective drain voltages (Vds) are illustrated for a symmetric metal oxide semiconductor (sMOS) device as compared to a bipolar metal oxide semiconductor (@MOS) device in linear scale. For example, lines 206, 208, 210, 212, and 214 represent the slope of the symmetric metal oxide semiconductor device. In contrast, lines 216, 218, and 220 represent the slope of the boosted vertical field-effect transistor device provided herein.

FIGS. 3A-19D illustrate a fabrication process for a boosted vertical transport field-effect transistor (VTFET) device structure (e.g., the device 100 of FIG. 1) in accordance with one or more embodiments described herein. The boosted VTFET structure can provide a steep slope and high drive current boosting while maintaining low off-state current. Further, the boosted VTFET structure can be a boosted MOS structure that can be fabricated in 5 nm VFET technology. As discussed herein, the various embodiments can relate to stacked vertical transport field effect transistors (VTFETs) logic cells.

The boosted VTFET structure can comprise a first vertical transport field effect transistor (first VTFET) and a second vertical transport field effect transistor (second VTFET). In an example, the boosted VTFET structure can comprise an n-channel field effect transistor (NFET) device and a p-channel field effect transistor (PFET) device.

FIG. 3A illustrates a top down view of an NFET device 302 of the VTFET device structure during a fabrication process wherein one or more fins are formed in accordance with one or more embodiments described herein. FIG. 3B illustrates a side cross-sectional view of the NFET device 302 taken along line 300 of FIG. 3A in accordance with one or more embodiments described herein. Repetitive description of like elements employed in other embodiments described herein is omitted for sake of brevity.

As illustrated in FIGS. 3A and 3B, the NFET device 302 can comprise an active area 306 (e.g., the active area 102) formed on a substrate. Material used for the active layer can vary. According to an aspect, the active area 306 can comprise Indium Gallium Arsenide (InGaAs), Gallium Arsenide (GaAs), Indium Phosphide (InP), silicon-germanium (SiGe), another material, or combinations thereof. In an aspect, the substrate can comprise a silicon wafer. According to another aspect, the NFET device 302 can comprise silicon dioxide on top of a silicon wafer. In another aspect, the substrate can comprise InGaAs, GaAs, InP, SiGe, or combinations thereof.

One or more fins (e.g., the one or more fins 104) can be formed within the active area 306. To form the one or more fins, a portions of a hard mask (HM) $308_1$, $308_2$, $308_3$ can be placed on respective portions of the active area 306. According to some implementations, the mask can be a silicon nitride mask. However, the disclosed aspects are not limited to this material for the mask and other materials can be utilized. After placement of the portions of the hard mask $308_1$, $308_2$, $308_3$, the active area 306 can be patterned (e.g., etched) to form trenches and semiconductor fins between the trenches. The trenches are illustrated as a first trench $310_1$, a second trench $310_2$, a third trench $310_3$, and a fourth trench $310_4$. Further, the one or more fins are illustrated as a first fin $312_1$, a second fin $312_2$, and a third fin $312_3$. Since the one or more fins are etched from the active area 306, the one or more fins can comprise the active layer material. According to some implementations, the first fin $312_1$, the second fin $312_2$, and the third fin $312_3$ can be VTFET channel fins.

Further, a shallow trench isolation region or STI region 314 (e.g., the shallow trench isolation region 106) can be formed around a perimeter of the active area 306. Shallow trench isolation is an integrated circuit feature that can reduce and/or mitigate electric current leakage between adjacent semiconductor device components. To form the STI region, a pattern of trenches can be etched on the perimeter of the active area 306. One or more dielectric materials can be deposited to fill the pattern of trenches on the perimeter of the active area 306. According to an implementation, a dielectric material of the one or more dielectric materials can be silicon dioxide. Excess amounts of the one or more dielectric materials can be removed using various techniques, such as chemical-mechanical planarization, for example. However, other techniques can be utilized during formation of the STI region 314.

Figure 3C:
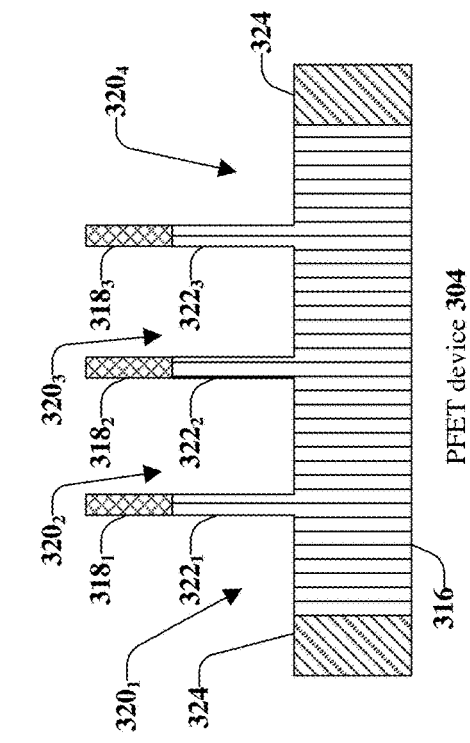
FIG. 3C illustrates a side cross-sectional view of a p-channel field effect transistor device of the vertical field-effect transistor device structure during a fabrication process wherein one or more fins are formed in accordance with one or more embodiments described herein.
Figure 3B:
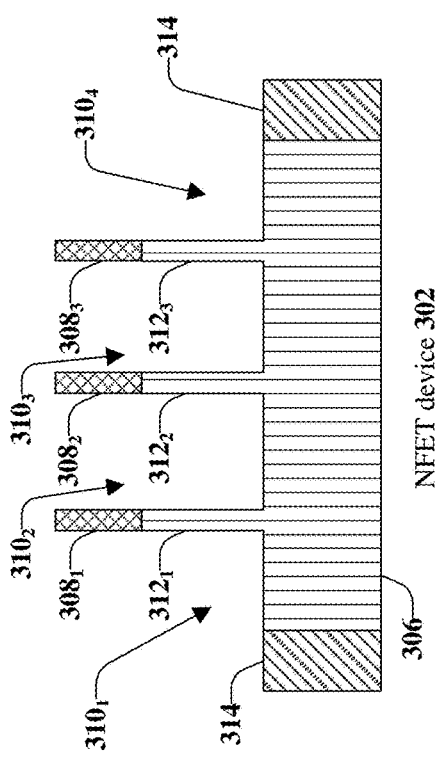
FIG. 3B illustrates a side cross-sectional view of the n-channel field effect transistor device of FIG. 3A in accordance with one or more embodiments described herein.

FIG. 3C illustrates a side cross-sectional view a PFET device 304 of the VFET device structure during a fabrication process wherein one or more fins are formed in accordance with one or more embodiments described herein. Repetitive description of like elements employed in other embodiments described herein is omitted for sake of brevity.

As illustrated in FIG. 3C, the fabrication of the PFET device 304 can be similar to the formation of the NFET device 302. According to some implementations, formation of the NFET device 302 and the PFET device 304 can be performed in parallel (e.g., at substantially the same time) through one or more fabrication stages, as discussed herein. For example, the PFET device 304 can comprise an active layer 316 formed on a substrate, which can comprise similar material as the NFET device 302 or different material. However, a doping of the active layer can be different for the NFET device 302 and the PFET device 304.

Respective portions of a hard mask $318_1$, $318_2$, and $318_3$ can be placed on the active layer 316 and one or more trenches and fins can be formed. Similar to the NFET device 302, the PFET device 304 can comprise a first trench $320_1$, a second trench $320_2$, a third trench $320_3$, and a fourth trench $320_4$. Further, the PFET device 304 can comprise a first fin $322_1$, a second fin $322_2$, and a third fin $322_3$. In addition, a STI region 324 can be formed on a perimeter of the active layer 316.

Figure 4A:
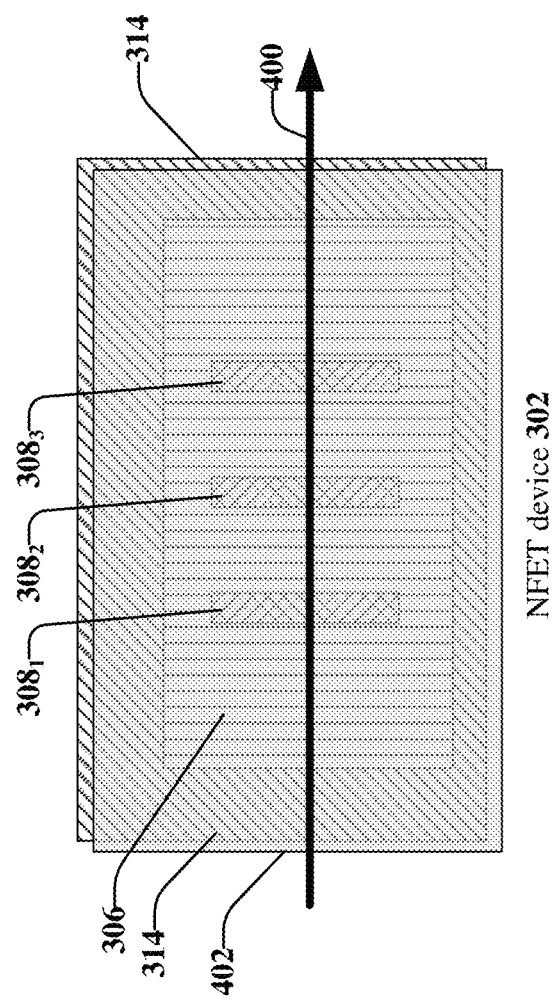
FIG. 4A illustrates a top down view of the n-channel field effect transistor device during a fabrication process wherein a spacer is deposited over and adjacent portions of the n-channel field effect transistor device in accordance with one or more embodiments described herein.

FIG. 4A illustrates a top down view of the NFET device 302 during a fabrication process wherein a spacer is deposited over and adjacent portions of the NFET device 302 in accordance with one or more embodiments described herein. FIG. 4B illustrates a side-cross sectional view of the NFET device 302 taken along line 400 of FIG. 4A in accordance with one or more embodiments described herein. Repetitive description of like elements employed in other embodiments described herein is omitted for sake of brevity.

As illustrated, a spacer 402 can be deposited over and adjacent portions of the NFET device 302. According to an implementation, the spacer 402 can comprise silicon nitride. As illustrated, the spacer 402 can be deposited on a top surface of the active area 306 exposed by the first trench $310_1$, the second trench $310_2$, the third trench $310_3$, and the fourth trench $310_4$. Further, the spacer 402 can be deposited on a top surface of the STI region 314, as illustrated. In addition, the spacer 402 can be deposited adjacent (e.g., surrounding) the first fin $312_1$, the second fin $312_2$, and the third fin $312_3$ of the NFET device 302. The spacer 402 can also be deposited over and adjacent the respective portions of the hard mask $308_1$, $308_2$, and $308_3$.

FIG. 4C illustrates a cross-sectional view of the PFET device 304 during a fabrication process wherein a spacer is deposited over and adjacent portions of the PFET device 304 in accordance with one or more embodiments described herein. Repetitive description of like elements employed in other embodiments described herein is omitted for sake of brevity. Similar to the NFET device 302 fabrication, a spacer 404 can be deposited on the PFET device 304 over the portions of the active layer 316 exposed by the first trench $320_1$, the second trench $320_2$, the third trench $320_3$, and the fourth trench $320_4$. The spacer 404 can also be deposited over the STI region 324. Further, similar to the fabrication of the NFET device 302, the spacer deposition for the PFET device 304 can comprise the spacer being deposited adjacent (e.g., surrounding) the first fin $322_1$, the second fin $322_2$, and the third fin $322_3$ of the PFET device 304. The spacer 404 can also be deposited over and adjacent the respective portions of the hard mask $318_1$, $318_2$, and $318_3$. The spacer 404 can comprise silicon nitride.

Figure 5A:
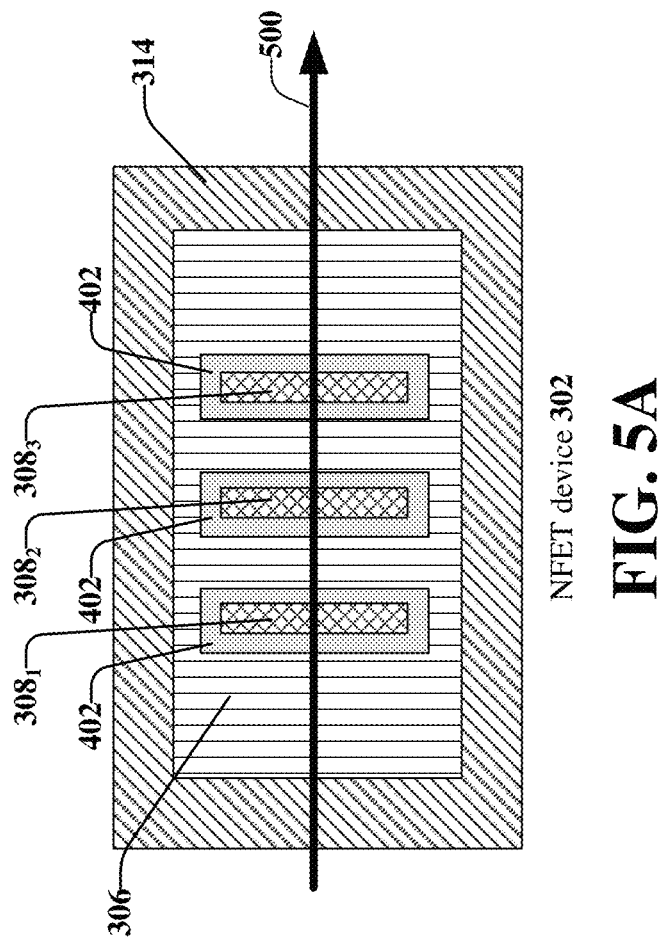
FIG. 5A illustrates a top down view of the n-channel field effect transistor device during a further fabrication process in accordance with one or more embodiments described herein.

FIG. 5A illustrates a top down view of the NFET device 302 during a further fabrication process in accordance with one or more embodiments described herein. FIG. 5B illustrates a side cross-sectional view of the NFET device 302 taken along line 500 of FIG. 5A in accordance with one or more embodiments described herein. Repetitive description of like elements employed in other embodiments described herein is omitted for sake of brevity.

During this portion of the fabrication process, the NFET device 302 is opened. To open the NFET device 302 one or more portions of the spacer 402 can be removed. Prior to removal of the one or more portions of the spacer 402, the area of the PFET device 304 can be blocked, as indicated in FIG. 5C, which illustrates the PFET device 304 during removal of spacer portions from the NFET device 302 (as well as one or more subsequent portions of the fabrication process) in accordance with one or more embodiments described herein. Repetitive description of like elements employed in other embodiments described herein is omitted for sake of brevity. Accordingly, the spacer 404 of the PFET device 304 is not removed during this stage of the fabrication process.

To open the NFET device 302, reactive ion etching (RIE) can be performed. RIE is a type of dry etching that can use chemically reactive plasma to remove material deposited on the NFET device 302. In an example, the plasma can be generated under low pressure (e.g., a vacuum) by an electromagnetic field. The low pressure can cause high-energy ions from the plasma to strike the surface of the NFET device 302 and react with the surface of the NFET device 302.

The RIE can be performed to remove bottom portions and top portions of the spacer 402. Side portions of the spacer 402 can remain intact. For example, portions of the spacer 402 that are over the top surface of the active area 306 exposed by the first trench $310_1$, the second trench $310_2$, the third trench $310_3$, and the fourth trench $310_4$ can be removed. Further, portions of the spacer 402 over the STI region 314 can be removed. In addition, the portions of the spacer 402 over the top surfaces of the respective portions of the hard mask $308_1$, $308_2$, $308_3$ can be removed.

During this portion of the fabrication process, portions of the spacer 402 adjacent the respective portions of the hard mask $308_1$, $308_2$, $308_3$ and the one or more fins (e.g., the first fin $312_1$, the second fin $312_2$, and the third fin $312_3$) are not removed. For example, as illustrated in FIG. 5B, the portions of the spacer 402 surrounding the one or more fins (e.g., the first fin $312_1$, the second fin $312_2$, and the third fin $312_3$) and the respective portions of the hard mask $308_1$, $308_2$, $308_3$ can remain after other portions of the spacer 402 are removed.

Figure 6A:
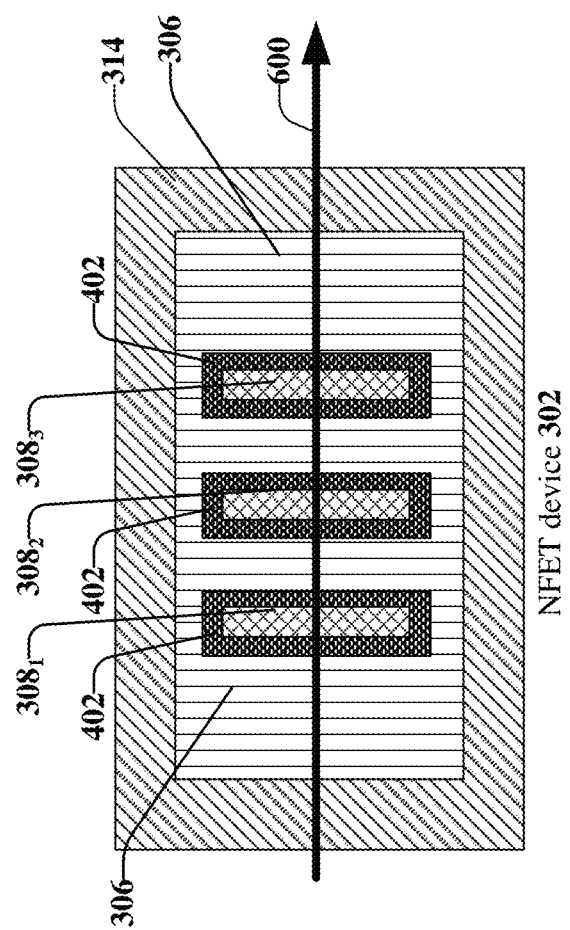
FIG. 6A illustrates a top down view of the n-channel field effect transistor device during a portion of the fabrication process wherein one or more portions of the active area are recessed in accordance with one or more embodiments described herein.

FIG. 6A illustrates a top down view of the NFET device 302 during a portion of the fabrication process wherein one or more portions of the active area 306 are recessed in accordance with one or more embodiments described herein. FIG. 6B illustrates a side view of the NFET device 302 taken along line 600 of FIG. 6A in accordance with one or more embodiments described herein. During this portion of the fabrication process, the PFET device 304 remains blocked and no processing is performed on the PFET device 304, as illustrated in FIG. 6C in accordance with one or more embodiments described herein. Repetitive description of like elements employed in other embodiments described herein is omitted for sake of brevity.

Portions of the active area 306 of the NFET device 302 can be recessed. For example, the portions of the active area 306 exposed by the first trench $310_1$, the second trench $310_2$, the third trench $310_3$, and the fourth trench $310_4$ can be recessed. In addition, portions of the active layer located under the spacer 402 areas adjacent the one or more fins (e.g., the first fin $312_1$, the second fin $312_2$, and the third fin $312_3$) can be recessed. In an example, a layer of the active area 306 that comprises a thickness in the range of between around 10 mm and 20 mm can be recessed during this portion of the fabrication process.

Figure 7A:
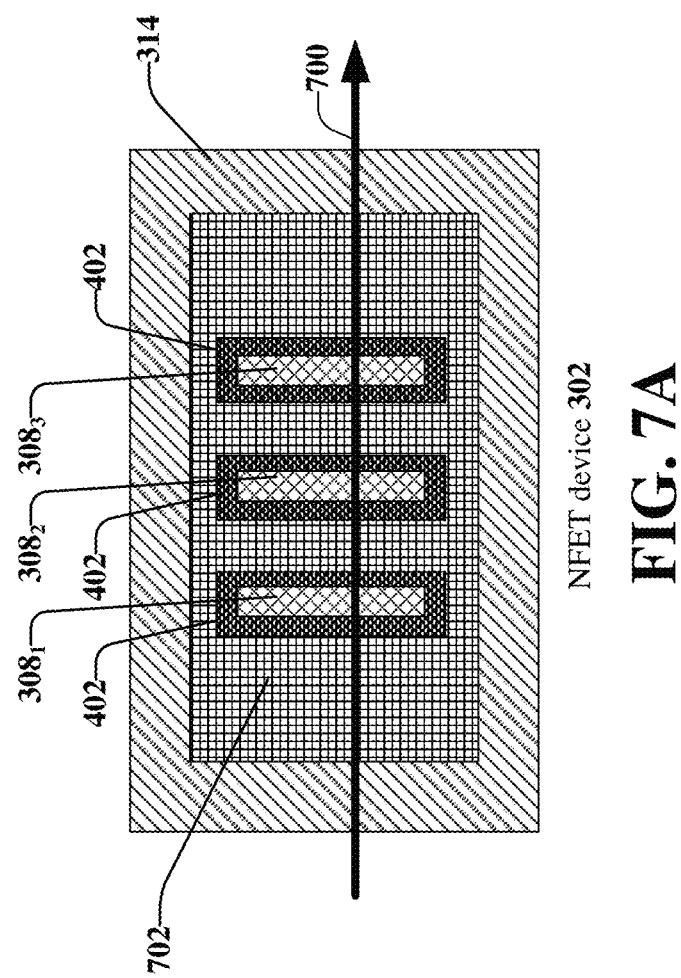
FIG. 7A illustrates a top down view of the n-channel field effect transistor device during a portion of the fabrication process wherein an epitaxial wafer is grown in accordance with one or more embodiments described herein.

FIG. 7A illustrates a top down view of the NFET device 302 during a portion of the fabrication process wherein an epitaxial wafer is grown in accordance with one or more embodiments described herein. FIG. 7B illustrates a side cross-sectional view of the NFET device 302 taken along line 700 of FIG. 7A in accordance with one or more embodiments described herein. During this portion of the fabrication process, the PFET device 304 remains blocked and no processing is performed on the PFET device 304, as illustrated in FIG. 7C in accordance with one or more embodiments described herein. Repetitive description of like elements employed in other embodiments described herein is omitted for sake of brevity.

As illustrated in FIGS. 7A and 7B, an epitaxial (EPI) wafer or EPI layer 702 (e.g., the first epitaxial layer 108) can be grown over and adjacent the portions of the active area 306 that were recessed as discussed above with respect to FIGS. 6A and 6B. The EPI layer 702 can be grown during an epitaxial (EPI) growth process. For example, the EPI layer 702 can comprise a semiconducting material. According to some implementations, the EPI layer 702 can be the same or similar material as the substrate. However, according to some implementations, if the active area 306 is silicon, which does not create an adequate contact layer, the EPI layer 702 can be provided to facilitate an adequate contact layer. Further to these implementations, the EPI layer 702 (e.g., the S/D contact) can be Silicon Carbide (SiC), InAs, InGaAs, or a combination thereof. According to additional or alternative implementations, the EPI layer 720 can be germanium, silicon germanium, or another material that can be implanted into the active area 306.

According to some implementations, an anneal operation (e.g., heat and cool) can be performed to diffuse the EPI layer (e.g., a source/drain region) under the one or more fins (e.g., the first fin $312_1$, the second fin $312_2$, and the third fin $312_3$) for high-k (HiK) reliability anneal and/or dopant diffusion control at a gate module.

Figure 8A:
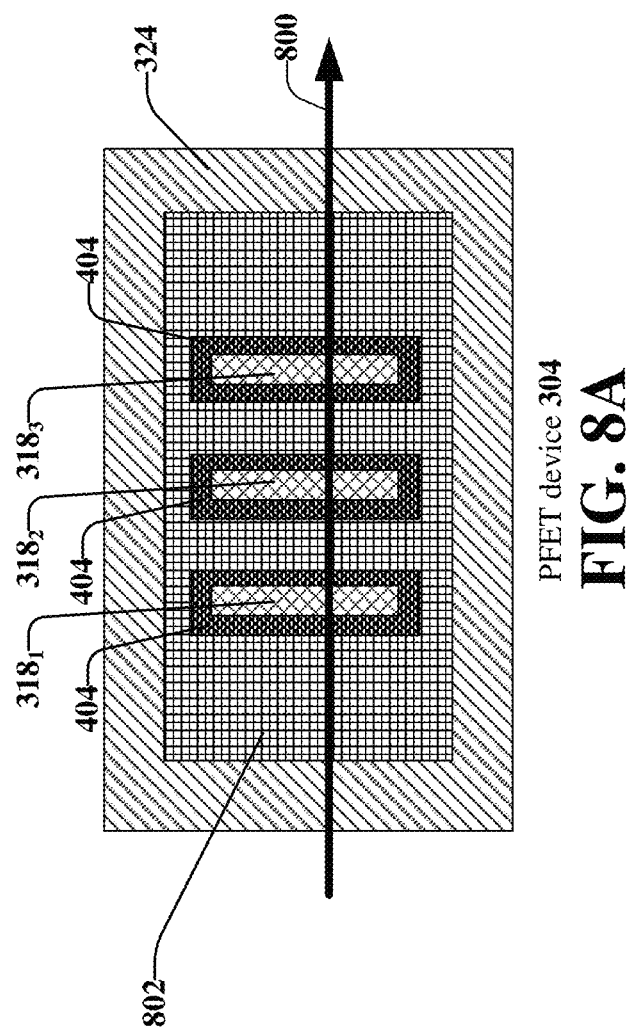
FIG. 8A illustrates a top down view of the p-channel field effect transistor device during one or more portions of the fabrication process in accordance with one or more embodiments described herein.

FIG. 8A illustrates a top down view of the PFET device 304 during one or more portions of the fabrication process in accordance with one or more embodiments described herein. Repetitive description of like elements employed in other embodiments described herein is omitted for sake of brevity. The one or more fabrication processes performed on the PFET device 304 can be similar to the one or more fabrication processes performed on the NFET device 302 as discussed with respect to FIGS. 5A to 7C.

Figure 8C:
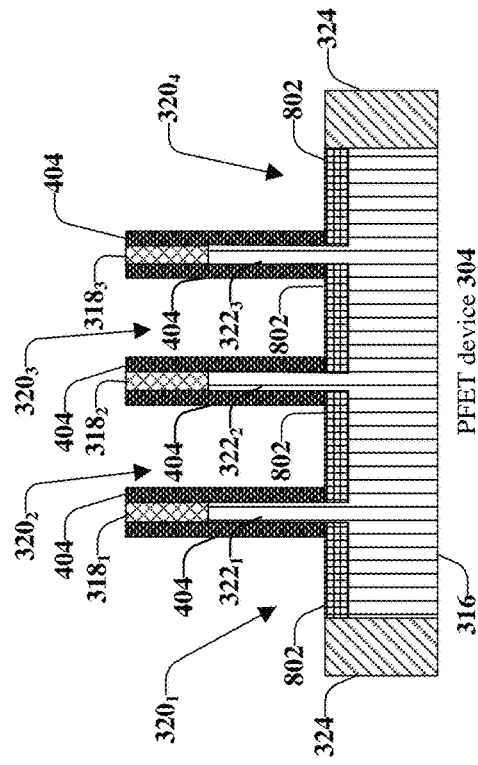
FIG. 8C illustrates a side cross-sectional view of the p-channel field effect transistor device of FIG. 8A in accordance with one or more embodiments described herein.
Figure 8B:
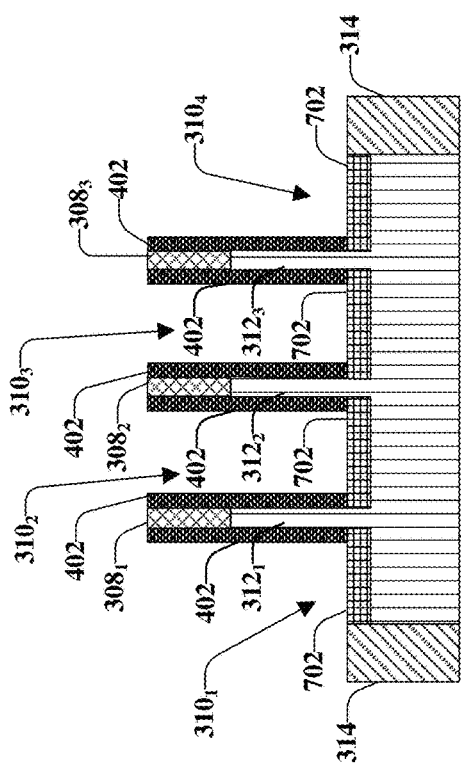
FIG. 8B illustrates a side cross-sectional view of the n-channel field effect transistor device while one or more fabrication processes are performed on the p-channel field effect transistor device in accordance with one or more embodiments described herein.

While the one or more fabrication processes are performed on the PFET device 304, the area of the NFET device 302 can be blocked (e.g., no fabrication processes are performed on the NFET device 302), as illustrated by the side cross-sectional view of the NFET device 302 in FIG. 8B in accordance with one or more embodiments described herein. Further, FIG. 8C illustrates a side cross-sectional view of the PFET device 304 taken along line 800 of FIG. 8A in accordance with one or more embodiments described herein. Repetitive description of like elements employed in other embodiments described herein is omitted for sake of brevity. For example, silicon nitride (SiN) capacitor deposition (cap dep) can be performed on the PFET device 304 while the area of the NFET device 302 can be blocked (e.g., FIG. 8B).

The PFET device 304 can be opened by removing one or more portions of the spacer 404. To open the PFET device 304, RIE can be performed to remove bottom portions and top portions of the spacer 404. Side portions of the spacer 404 can remain intact. For example, portions of the spacer 404 that are over the top surface of the active layer 316 exposed by the first trench $320_1$, the second trench $320_2$, the third trench $320_3$, and the fourth trench $320_4$ can be removed. Further, portions of the spacer 404 over the STI region 324 can be removed. In addition, the portions of the spacer 404 over the top surfaces of the respective portions of the hard mask $318_1$, $318_2$, $318_3$ can be removed.

During this portion of the fabrication process, portions of the spacer 404 adjacent the respective portions of the hard mask $318_1$, $318_2$, $318_3$ and the one or more fins (e.g., the first fin $322_1$, the second fin $322_2$, and the third fin $322_3$) are not removed. For example, as illustrated in FIG. 8C, the portions of the spacer 404 surrounding the one or more fins (e.g., the first fin $322_1$, the second fin $322_2$, and the third fin $322_3$) and the respective portions of the hard mask $318_1$, $318_2$, $318_3$ can remain after other portions of the spacer 404 are removed.

Further, portions of the active layer 316 can be recessed. For example, the portions of the active layer 316 exposed by the first trench $320_1$, the second trench $320_2$, the third trench $320_3$, and the fourth trench $320_4$ can be recessed. In addition, portions of the active layer located under the spacer 404 areas adjacent the one or more fins (e.g., the first fin $322_1$, the second fin $322_2$, and the third fin $322_3$) can be recessed. In an example, a layer of the active area 306 that comprises a thickness in the range of between around 10 mm and 20 mm can be recessed during the fabrication process. In an embodiment, an Organic Planarizing Layer (OPL) strip can be included.

Thereafter, an epitaxial (EPI) wafer or EPI layer 802 can be formed over and adjacent the portions of the active area 306 that were recessed as discussed in the above paragraph. The EPI layer 802 can be formed during an epitaxial (EPI) growth process. For example, the EPI layer 802 can comprise a semiconducting material. According to some implementations, the EPI layer 802 can be the same or similar material as the active layer 316. However, according to some implementations, if the active layer 316 is silicon, which does not create an adequate contact layer, the EPI layer 802 can be provided to facilitate an adequate contact layer (e.g., a S/D contact). Further to these implementations, the EPI layer 802 can be, for example, Ge or SiGe with boron (B), AL, Ga doping, or another material that can be implanted into the active layer 316.

According to some implementations, an anneal operation can be performed to diffuse the EPI layer 802 (e.g., a source/drain region) under the one or more fins (e.g., the first fin $322_1$, the second fin $322_2$, and the third fin $322_3$) to HiK reliability anneal at the gate module.

Figure 9A:
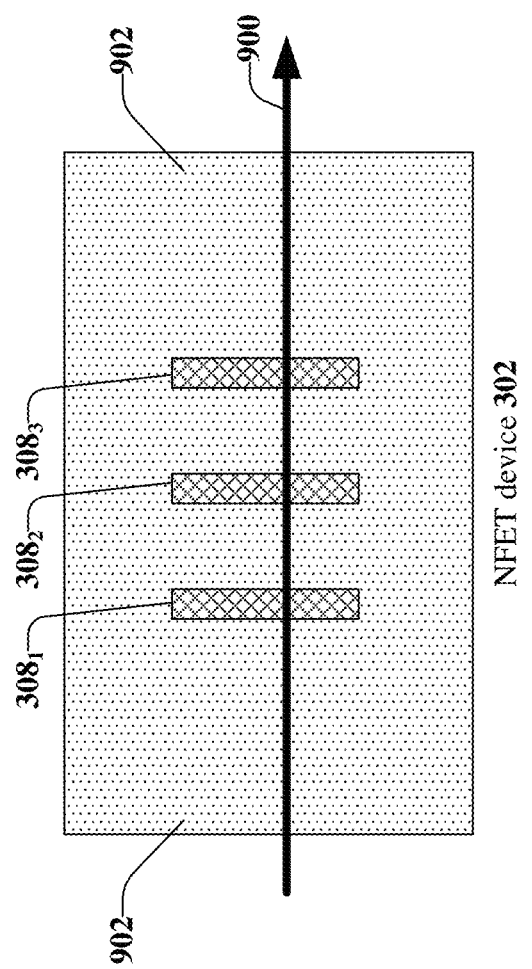
FIG. 9A illustrates a top down view of the n-channel field effect transistor device during a portion of the fabrication process wherein a high-density plasma can be deposited in accordance with one or more embodiments described herein.
Figure 9B:
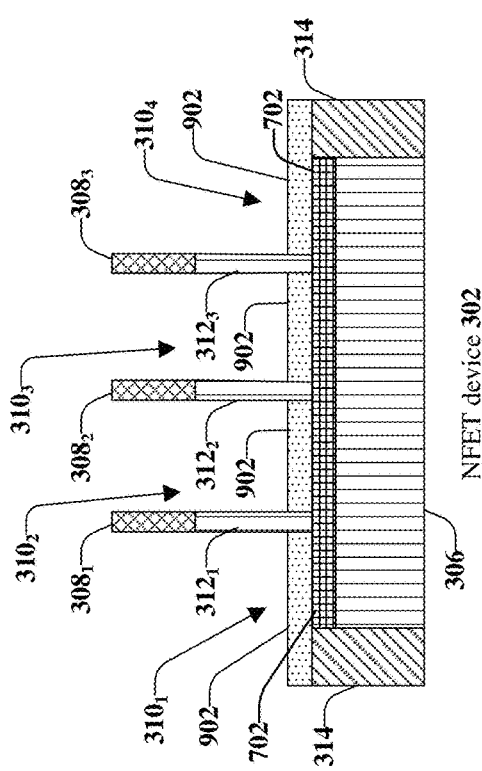
FIG. 9B illustrates a side cross-sectional view of the n-channel field effect transistor device of FIG. 9A in accordance with one or more embodiments described herein.
Figure 9C:
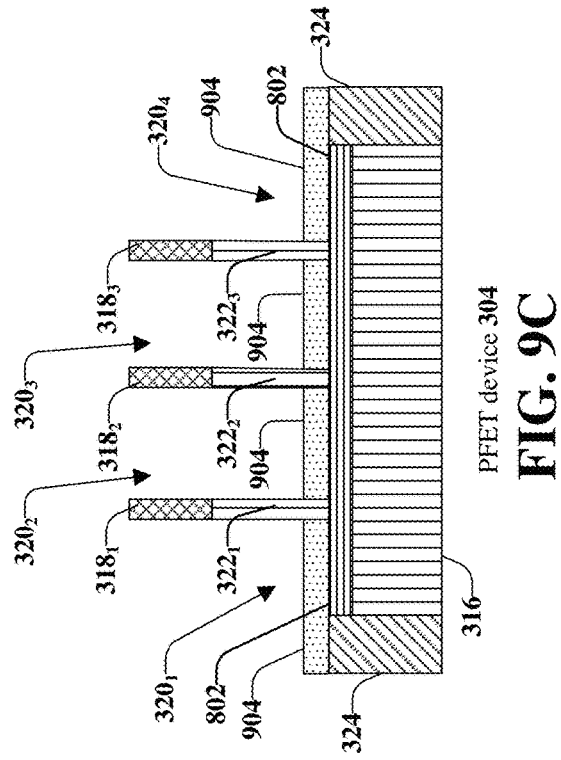
FIG. 9C illustrates a side cross-sectional view of the p-channel field effect transistor device during a portion of the fabrication process wherein a high-density plasma can be deposited in accordance with one or more embodiments described herein.

FIG. 9A illustrates a top down view of the NFET device 302 during a portion of the fabrication process wherein a high-density plasma can be deposited in accordance with one or more embodiments described herein. FIG. 9B illustrates a side cross-sectional view of the NFET device 302 taken along line 900 of FIG. 9A in accordance with one or more embodiments described herein. Further, FIG. 9C illustrates a side cross-sectional view of the PFET device 304 during a portion of the fabrication process wherein a high-density plasma can be deposited in accordance with one or more embodiments described herein. Repetitive description of like elements employed in other embodiments described herein is omitted for sake of brevity.

As illustrated in FIGS. 9A and 9B, a high-density plasma layer or HDP layer 902 (e.g., a HDP bottom spacer) can be deposited on the EPI layer 702. For example, a first portion of the HDP layer 902 can be deposited over the STI region 314 and over the EPI layer 702 in sections defined by the first trench $310_1$, the second trench $310_2$, the third trench $310_3$, and the fourth trench $310_4$. The HDP layer 902 can be a bottom thick layer and can be deposited using a WET process. For example, the HDP layer 902 can have a thickness in a range of about 3 nm to around 30 nm. According to an implementation, the HDP layer 902 can comprise silicon nitride.

In a similar manner, an HDP layer 904 (e.g., a HDP bottom spacer) can be deposited on the bottom spacer of the PFET device 304. The HDP layer 904 can comprise silicon nitride. Thus, portions of the HDP layer 904 can be deposited over the STI region 324 and over the EPI layer 802 in sections defined by the first trench $320_1$, the second trench $320_2$, the third trench $320_3$, and the fourth trench $320_4$.

Figure 10A:
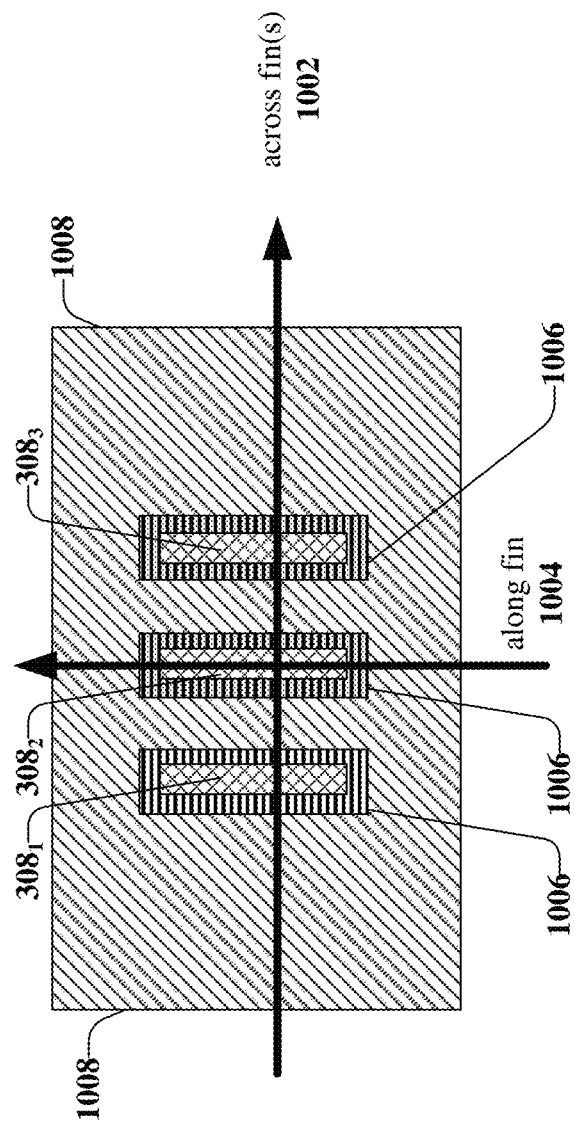
FIG. 10A illustrates a top down view of the n-channel field effect transistor device during a fabrication process wherein a self-aligned gate is formed around the vertical fin channels in accordance with one or more embodiments described herein.

FIG. 10A illustrates a top down view of the NFET device 302 during a fabrication process wherein a self-aligned gate is formed around the vertical fin channels in accordance with one or more embodiments described herein. FIG. 10B illustrates a side cross-sectional view of the NFET device 302 at line 1002, which is across the one or more fins (e.g., along the first fin $312_1$, the second fin $312_2$, and the third fin $312_3$) of FIG. 10A in accordance with one or more embodiments described herein. FIG. 10C illustrates a side cross-sectional view of the NFET device 302 at line 1004 (e.g., along the second fin $312_2$) of FIG. 10A in accordance with one or more embodiments described herein. Repetitive description of like elements employed in other embodiments described herein is omitted for sake of brevity.

A self-aligned gate can be formed around the vertical fin channels (e.g., the first fin $312_1$, the second fin $312_2$, and the third fin $312_3$). The self-aligned gate can comprise a high k dielectric and work function metal (WFM) layer (e.g., a HiK/WFM layer 1006) and a spacer 1008. The HiK/WFM layer 1006 can be deposited over the HDP layer 902 and adjacent at least a portion of the one or more fins (e.g., the first fin $312_1$, the second fin $312_2$, and the third fin $312_3$). The spacer 1008 can be deposited over and adjacent the HiK/WFM layer 1006. A reactive ion etching (RIE) process can be performed on the HiK/WFM layer 1006 and the spacer 1008 to form the self-aligned gate. According to some implementations, a block pattern can be used to form the self-aligned gate, which can be different for a first WFM layer of the NFET device 302 and a second WMF layer of the PFET device 304 (not illustrated for purposes of simplicity).

Figure 11A:
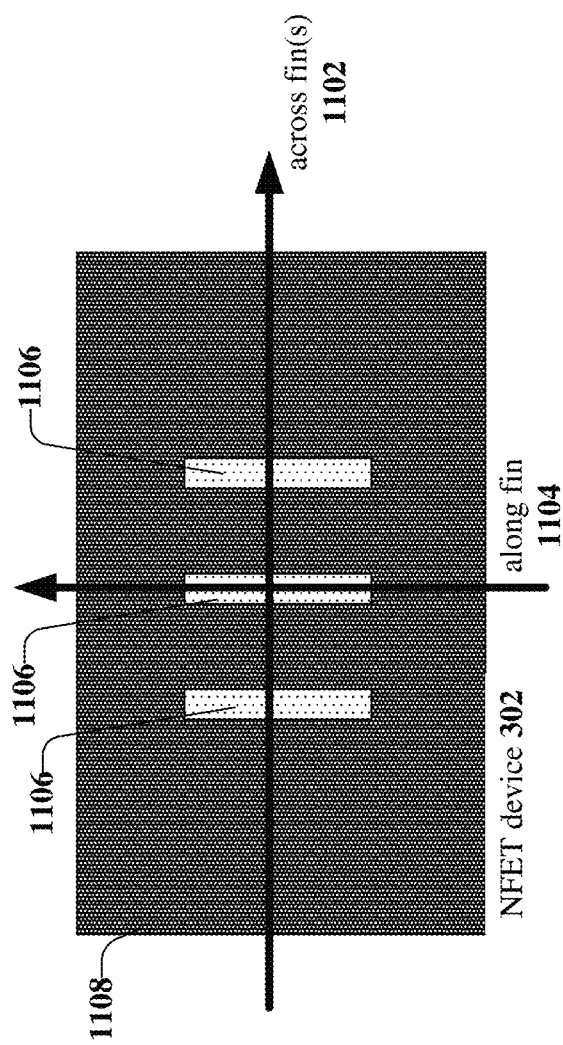
FIG. 11A illustrates a top down view of the n-channel field effect transistor device during a fabrication process wherein a top spacer and field oxide layer are deposited in accordance with one or more embodiments described herein.
Figure 11B:
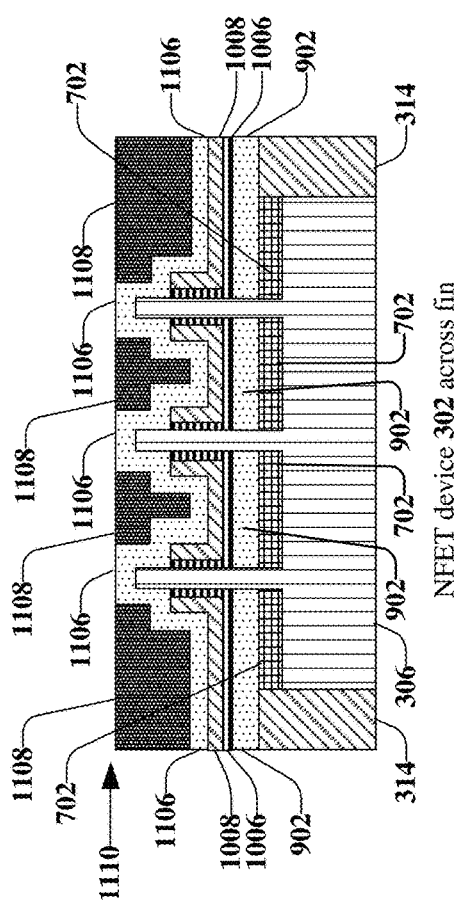
FIG. 11B illustrates a side cross-sectional view of the n-channel field effect transistor device of FIG. 11A in accordance with one or more embodiments described herein.
Figure 11C:
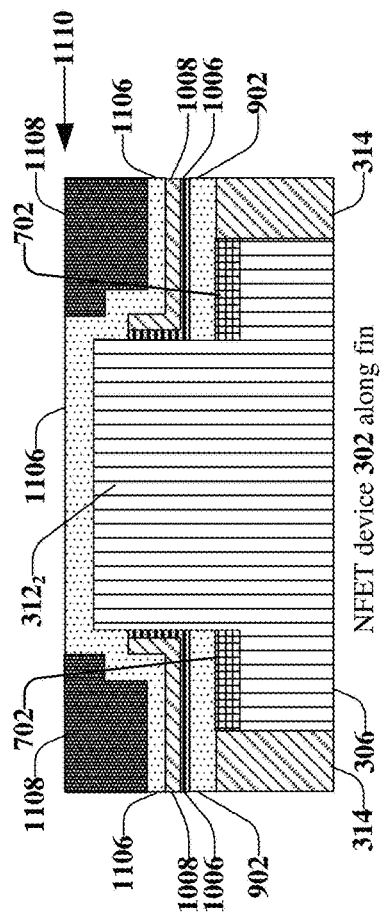
FIG. 11C illustrates another side cross-sectional view of the n-channel field effect transistor device of FIG. 11A in accordance with one or more embodiments described herein.

FIG. 11A illustrates a top down view of the NFET device 302 during a fabrication process wherein a top spacer and field oxide layer are deposited in accordance with one or more embodiments described herein. FIG. 11B illustrates a side cross-sectional view of the NFET device at line 1102, which is across the one or more fins (e.g., across the first fin $312_1$, the second fin $312_2$, and the third fin $312_3$) and FIG. 11C illustrates a side cross-sectional view of the NFET device at line 1104 (e.g., along the second fin $312_2$) of FIG. 11A in accordance with one or more embodiments described herein. Repetitive description of like elements employed in other embodiments described herein is omitted for sake of brevity.

As illustrated, a nitride liner layer 1106 can be deposited over and adjacent the spacer 1008 and the portions of the hard mask (not shown). The nitride liner layer 1106 can also be deposited over top portions of the HiK/WFM layer 1006 adjacent the one or more fins (e.g., the first fin 312₁, the second fin 312₂, and the third fin 312₃). Further, a layer of silicon oxide 1108 can be deposited over and adjacent the nitride liner layer 1106.

Thereafter a chemical mechanical polishing/planarization (CMP) can be performed. The CMP process can smooth surfaces (e.g., a top surface of the NFET device 302) with a combination of chemical and mechanical forces. The CMP process can be stopped at the top nitride layer or at a top plane 1110 (e.g., top of the hard mask 308 of the NFET device 302.

Figure 12A:
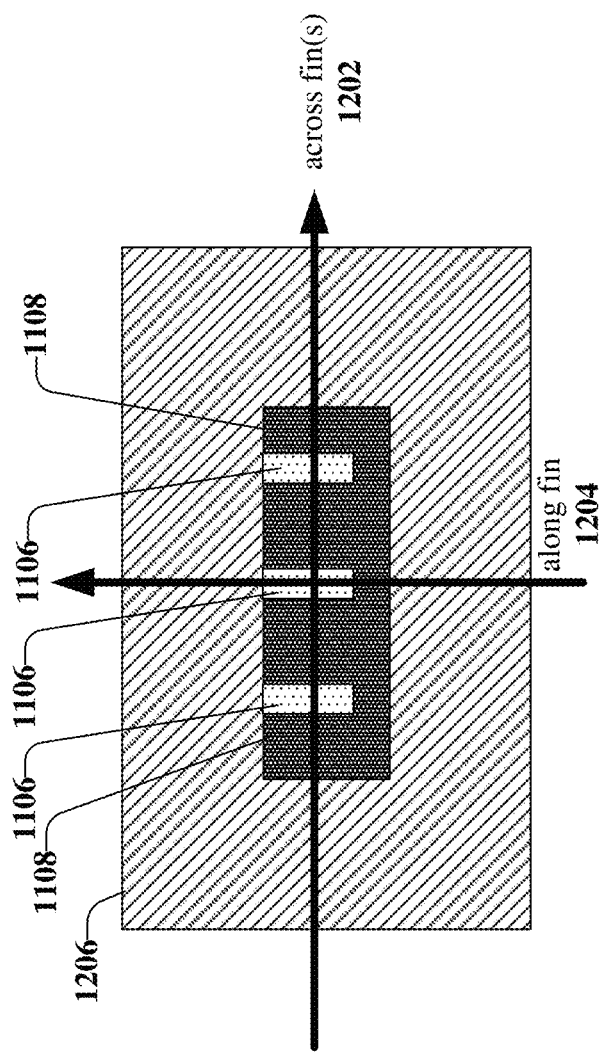
FIG. 12A illustrates a top down view of the n-channel field effect transistor device during a fabrication process wherein patterning and opening of a center of the hard mask can be performed in accordance with one or more embodiments described herein.
Figure 12B:
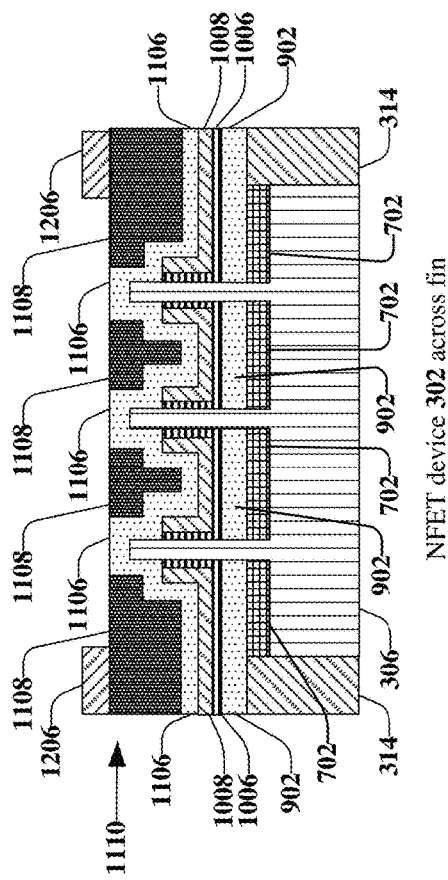
FIG. 12B illustrates a side cross-sectional view of the n-channel field effect transistor device of FIG. 12A in accordance with one or more embodiments described herein.
Figure 12C:
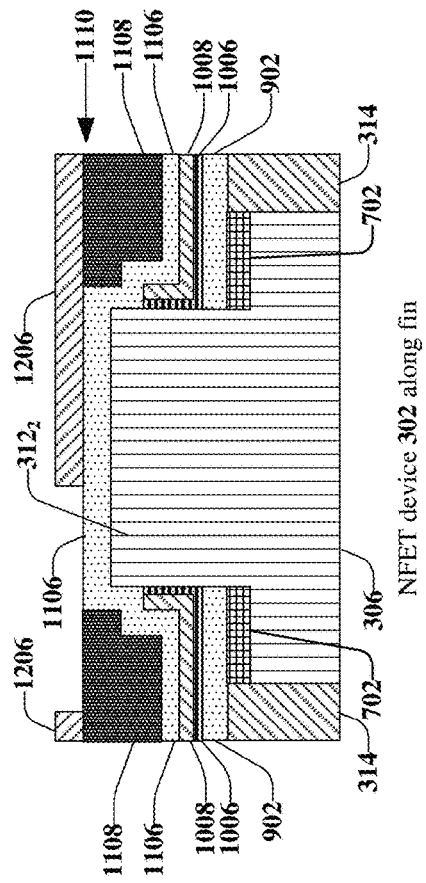
FIG. 12C illustrates another side cross-sectional view of the n-channel field effect transistor device of FIG. 12A in accordance with one or more embodiments described herein.

FIG. 12A illustrates a top down view of the NFET device 302 during a fabrication process wherein patterning and opening of a center of the hard mask 308 can be performed in accordance with one or more embodiments described herein. FIG. 12B illustrates a side cross-sectional view of the NFET device 302 at line 1202 of FIG. 12A, which is across the one or more fins (e.g., across the first fin 312₁, the second fin 312₂, and the third fin 312₃) in accordance with one or more embodiments described herein. FIG. 12C illustrates a side cross-sectional view of the NFET device at line 1204 (e.g., along the second fin 312₂) of FIG. 12A in accordance with one or more embodiments described herein. Repetitive description of like elements employed in other embodiments described herein is omitted for sake of brevity.

As illustrated, a photoresist coating 1206 (e.g., a PR coating) can be patterned over the top plane 1110 of the NFET device 302 (e.g., over a top surface of the nitride liner layer 1106 and the silicon oxide 1108). A center portion of the hard mask can be opened. Accordingly, one side of fins of the one or more fins (e.g., the first fin 312₁, the second fin 312₂, and the third fin 312₃) can be opened up or exposed. For example, the photoresist coating 1206 can be removed at these areas. Thus, as illustrated in FIG. 12C, a first portion 1208 of the nitride liner layer 1106 and the silicon oxide 1108 is exposed along the second fin 312₂.

Figure 13C:
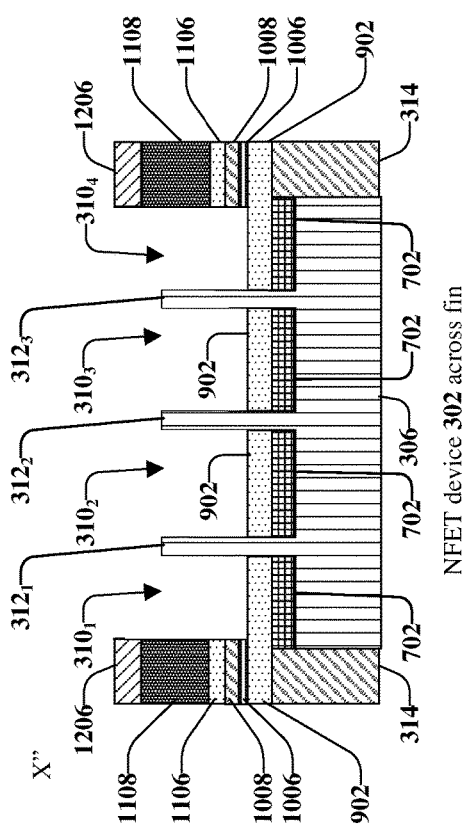
FIG. 13C illustrates another side cross-sectional view of the n-channel field effect transistor device of FIG. 13A in accordance with one or more embodiments described herein.
Figure 13D:
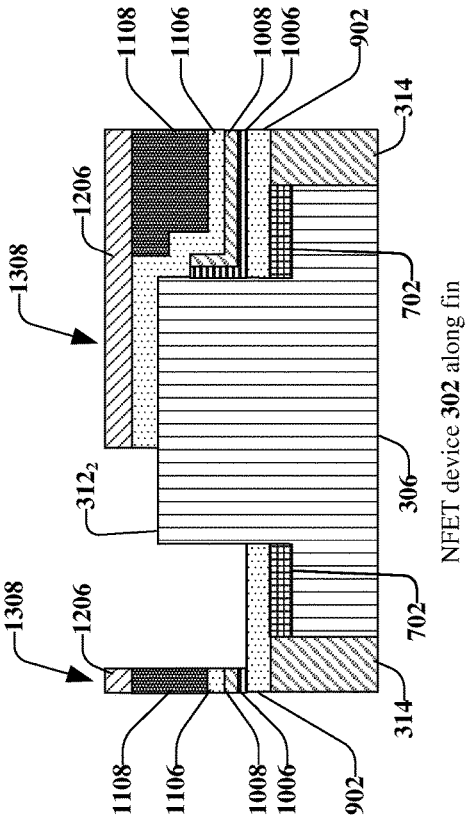
FIG. 13D illustrates a further side cross-sectional view of the n-channel field effect transistor device of FIG. 13A in accordance with one or more embodiments described herein.

FIG. 13A illustrates a top down view of the NFET device 302 during a portion of the fabrication process wherein one or more layers are removed in accordance with one or more embodiments described herein. FIG. 13B illustrates a side cross-sectional view of the NFET device 302 at line 1302 (X') of FIG. 13A in accordance with one or more embodiments described herein. FIG. 13C illustrates a side cross-sectional view of the NFET device 302 at line 1304 (e.g., X" or across the one or more fins) and FIG. 13D illustrates a side cross-sectional view of the NFET device at line 1306 (e.g., along the second fin 312₂) in accordance with one or more embodiments described herein. Repetitive description of like elements employed in other embodiments described herein is omitted for sake of brevity.

During this stage of the fabrication process, one or more layers of the NFET device 302 can be etched away. For example, a mask 1308 can be placed over the photoresist coating 1206 (as illustrated in FIG. 13D). Thus, the mask 1308 can be placed over the portions of the NFET device 302 that are not to be removed during this process.

As indicated in FIG. 13C, portions of the HiK/WFM layer 1006, the spacer 1008, the nitride liner layer 1106, and the silicon oxide 1108 within the one or more trenches (e.g., the first trench 310₁, the second trench 310₂, the third trench 310₃, and the fourth trench 310₄) can be removed. Thus, a top surface of the HDP layer 902 can be exposed.

Accordingly, top surfaces of the one or more fins (e.g., the first fin 312₁, the second fin 312₂, and the third fin 312₃) can be exposed. It is noted that the portions of the HiK/WFM layer 1006, the spacer 1008, the nitride liner layer 1106, and the silicon oxide 1108 located under the photoresist coating 1206 are not removed, due to the mask 1308.

Figure 14C:
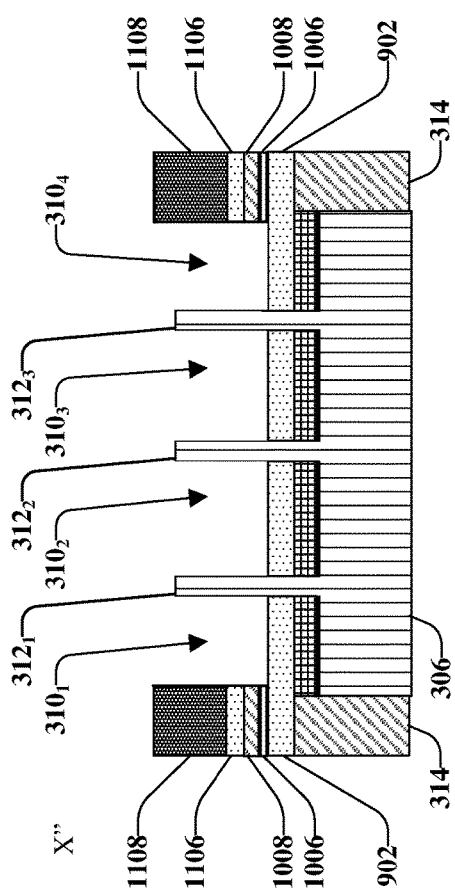
FIG. 14C illustrates another side cross-sectional view of the n-channel field effect transistor device of FIG. 14A in accordance with one or more embodiments described herein.
Figure 14D:
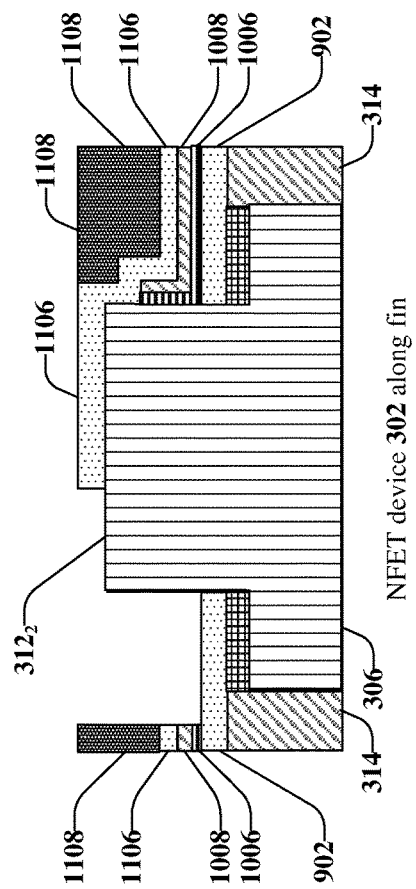
FIG. 14D illustrates a further side cross-sectional view of the n-channel field effect transistor device of FIG. 14A in accordance with one or more embodiments described herein.

FIG. 14A illustrates a top down view of the NFET device 302 during a portion of the fabrication process wherein the mask 1308 and the photoresist coating 1206 can be removed in accordance with one or more embodiments described herein. FIG. 14B illustrates a side cross-sectional view of the NFET device 302 at line 1402 (X') of FIG. 14A in accordance with one or more embodiments described herein. FIG. 14C illustrates a side cross-sectional view of the NFET device 302 at line 1404 (e.g., X" or across the one or more fins) and FIG. 14D illustrates a side cross-sectional view of the NFET device at line 1406 (e.g., along the second fin 312₂) in accordance with one or more embodiments described herein. Repetitive description of like elements employed in other embodiments described herein is omitted for sake of brevity.

As illustrated, the mask 1308 and photoresist coating 1206 can be removed during this stage of the fabrication process. Various techniques for removing the mask can be utilized and will not be discussed further herein. Upon or after removal of the mask 1308 and photoresist coating 1206, top portions of the nitride liner layer 1106 and the silicon oxide 1108 can be exposed.

Figures 15A, 15B:
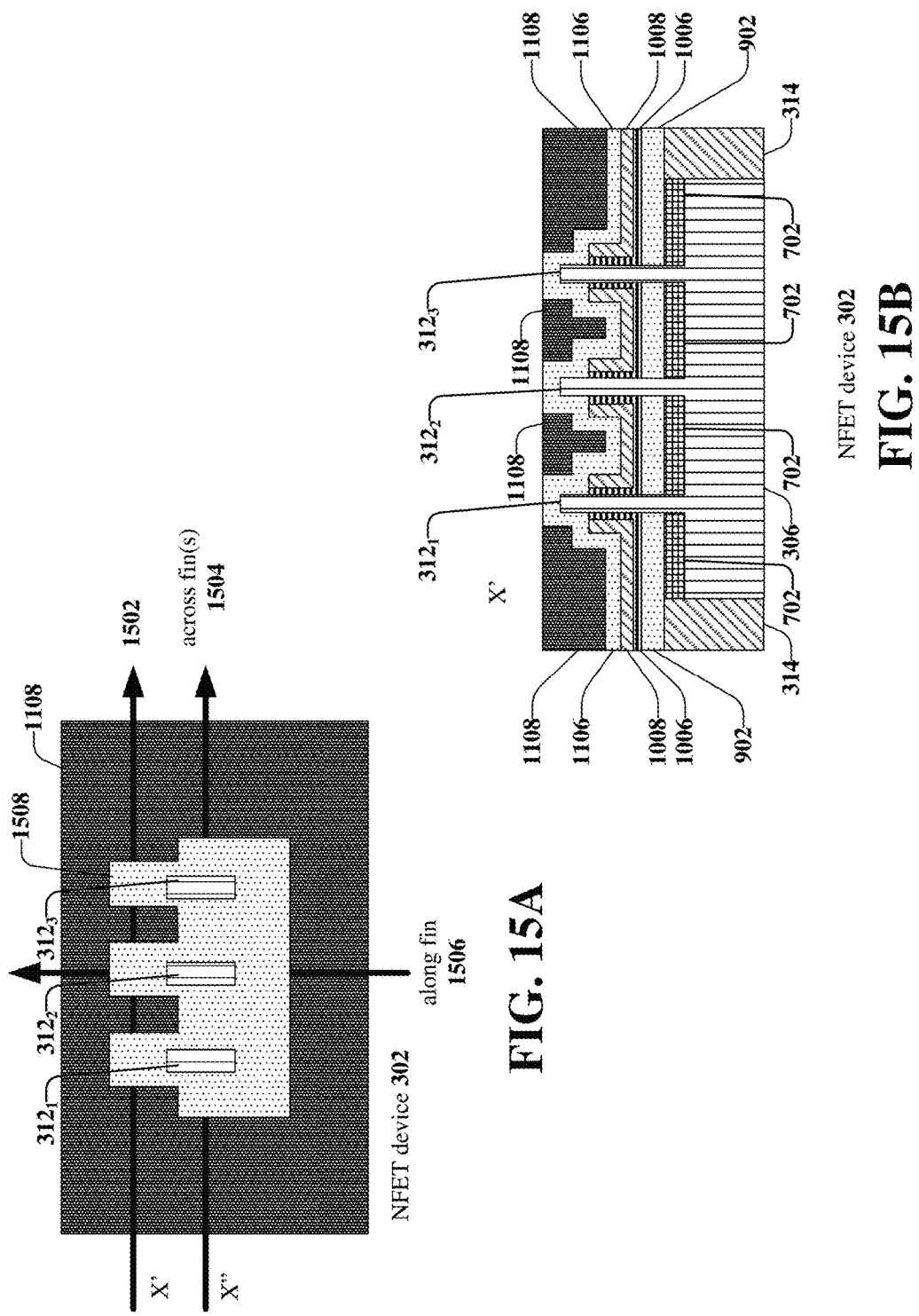
FIG. 15A illustrates a top down view of the n-channel field effect transistor device during a portion of the fabrication process wherein a spacer is deposited in accordance with one or more embodiments described herein.
FIG. 15B illustrates a side cross-sectional view of the n-channel field effect transistor device of FIG. 15A in accordance with one or more embodiments described herein.
Figure 15C:
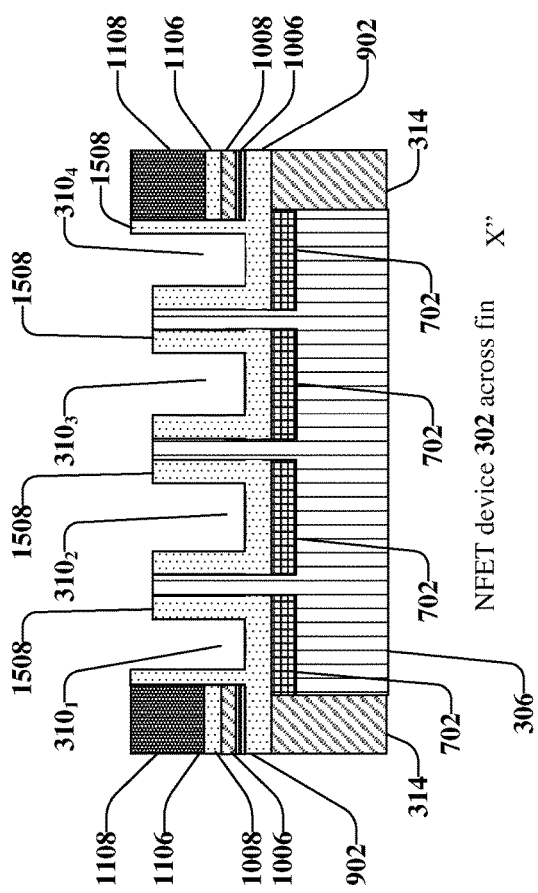
FIG. 15C illustrates another side cross-sectional view of the n-channel field effect transistor device of FIG. 15A in accordance with one or more embodiments described herein.
Figure 15D:
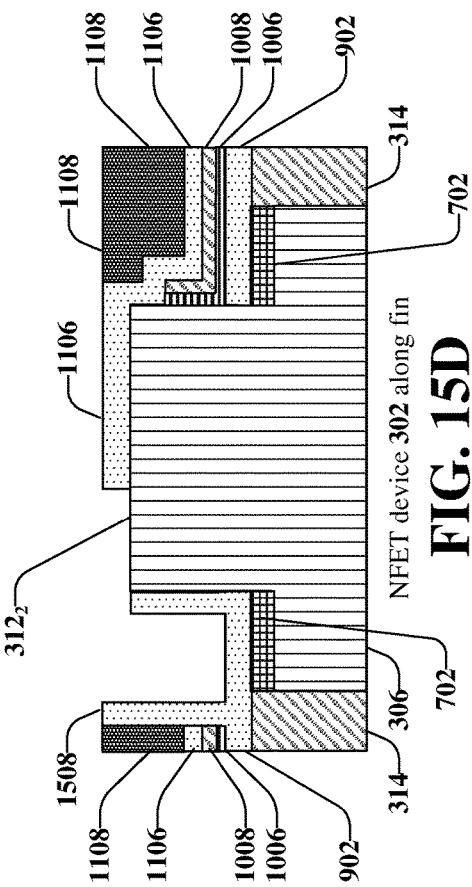
FIG. 15D illustrates a further side cross-sectional view of the n-channel field effect transistor device of FIG. 15A in accordance with one or more embodiments described herein.

FIG. 15A illustrates a top down view of the NFET device 302 during a portion of the fabrication process wherein a spacer is deposited in accordance with one or more embodiments described herein. FIG. 15B illustrates a side cross-sectional view of the NFET device 302 at line 1502 (X') of FIG. 15A in accordance with one or more embodiments described herein. FIG. 15C illustrates a side cross-sectional view of the NFET device 302 at line 1504 (e.g., X" or across the one or more fins) and FIG. 15D illustrates a side cross-sectional view of the NFET device at line 1506 (e.g., along the second fin 312₂) in accordance with one or more embodiments described herein. Repetitive description of like elements employed in other embodiments described herein is omitted for sake of brevity.

As illustrated, a spacer 1508 can be deposited adjacent the HiK/WFM layer 1006, the spacer 1008, the nitride liner layer 1106, the silicon oxide 1108, and the one or more fins (e.g., the first fin 312₁, the second fin 312₂, and the third fin 312₃) and over the EPI layer 702. For example, the spacer 1508 can be deposited within an area represented by the trenches (the first trench 310₁, the second trench 310₂, the third trench 310₃, and the fourth trench 310₄). According to an implementation, the spacer 1508 can comprise silicon nitride (SiN). Upon or after the spacer 1508 is deposited, dry etching can be performed. In an implementation, the spacer 1508 can comprise a similar thickness at the various portions of the NFET device 302 (e.g., within the areas represented by the trenches (the first trench 310₁, the second trench 310₂, the third trench 310₃, and the fourth trench 310₄).

Figure 16C:
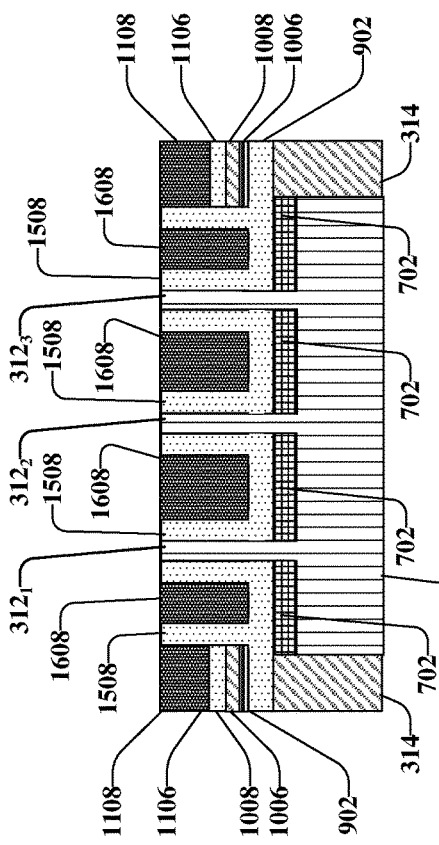
FIG. 16C illustrates another side cross-sectional view of the n-channel field effect transistor device of FIG. 16A in accordance with one or more embodiments described herein.
Figure 16D:
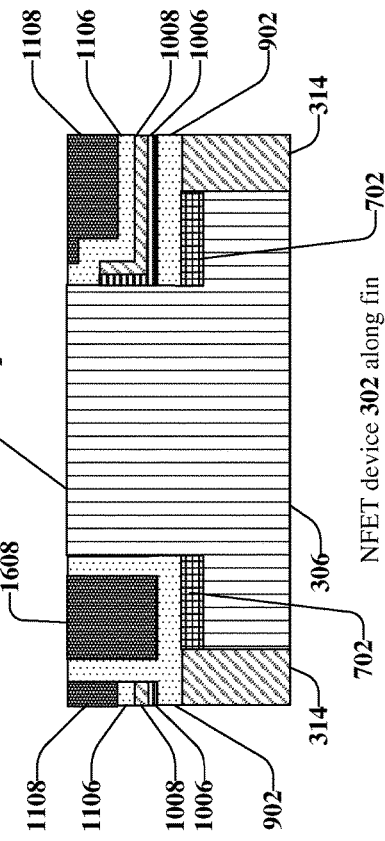
FIG. 16D illustrates a further side cross-sectional view of the n-channel field effect transistor device of FIG. 16A in accordance with one or more embodiments described herein.

FIG. 16A illustrates a top down view of the NFET device 302 during a portion of the fabrication process wherein oxide deposition and a chemical mechanical polishing/planarization (CMP) process are performed in accordance with one or more embodiments described herein. FIG. 16B illustrates a side cross-sectional view of the NFET device 302 at line 1602 (X') of FIG. 16A in accordance with one or more embodiments described herein. FIG. 16C illustrates a side cross-sectional view of the NFET device 302 at line 1604 (e.g., X" or across the one or more fins) and FIG. 16D illustrates a side cross-sectional view of the NFET device at line 1606 (e.g., along the second fin 312₂) in accordance with one or more embodiments described herein. Repetitive description of like elements employed in other embodiments described herein is omitted for sake of brevity.

As illustrated, a layer of oxide 1608 can be deposited over and adjacent the spacer 1508. For example, the layer of oxide 1608 can fill the one or more trenches (e.g., the first trench 310₁, the second trench 310₂, the third trench 310₃, and the fourth trench 310₄).

Upon or after deposition of the layer of oxide 1608, a CMP process can be performed. As illustrated the CMP can stop at the nitride layer. Therefore, a top portion of the nitride liner layer 1106 and a top portion of the layer of silicon oxide 1108 can be removed during the CMP process.

FIG. 17A illustrates a top down view of the NFET device 302 during a portion of the fabrication process wherein top portions of the one or more fins are revealed in accordance with one or more embodiments described herein. FIG. 17B illustrates a side cross-sectional view of the NFET device 302 at line 1702 (X') of FIG. 17A in accordance with one or more embodiments described herein. FIG. 17C illustrates a side cross-sectional view of the NFET device 302 at line 1704 (e.g., X" or across the one or more fins) and FIG. 17D illustrates a side cross-sectional view of the NFET device at line 1706 (e.g., along the second fin 312₂) in accordance with one or more embodiments described herein. Repetitive description of like elements employed in other embodiments described herein is omitted for sake of brevity.

A layer of silicon nitride (SiN) can be deposited. For example, patterning can be performed and then the layer of silicon nitride 1708 can be deposited. The layer of silicon nitride 1708 (as best viewed in FIGS. 17A and 17D) can provide a separation between the vertical FINFet device and a bipolar junction transistor (BJT).

Upon or after the depositing of the silicon nitride 1708, top portions of the one or more fins (e.g., the first fin 312₁, the second fin 312₂, and the third fin 312₃) can be opened up. For example, recessing can be performed at the areas marked at 1710.

Figure 18A:
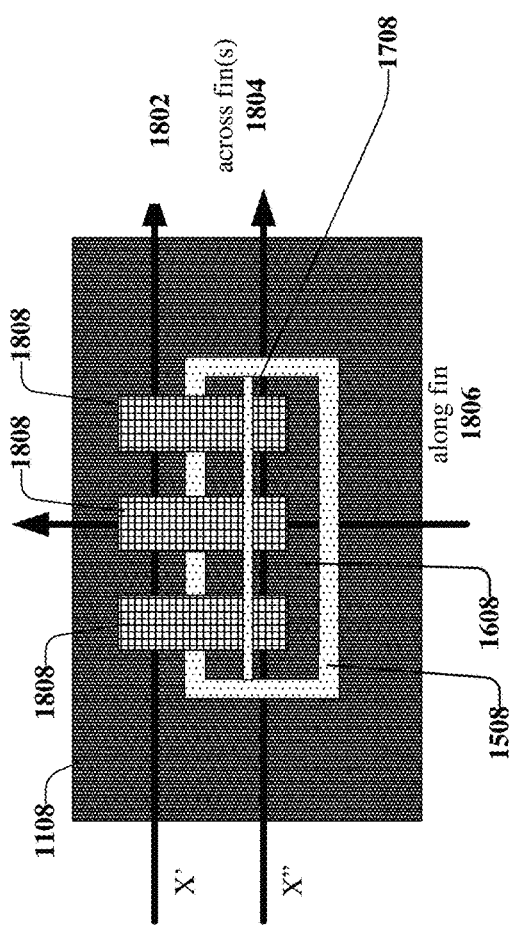
FIG. 18A illustrates a top down view of the n-channel field effect transistor device during a portion of the fabrication process wherein an epitaxial layer (EPI) is grown in accordance with one or more embodiments described herein.
Figure 18B:
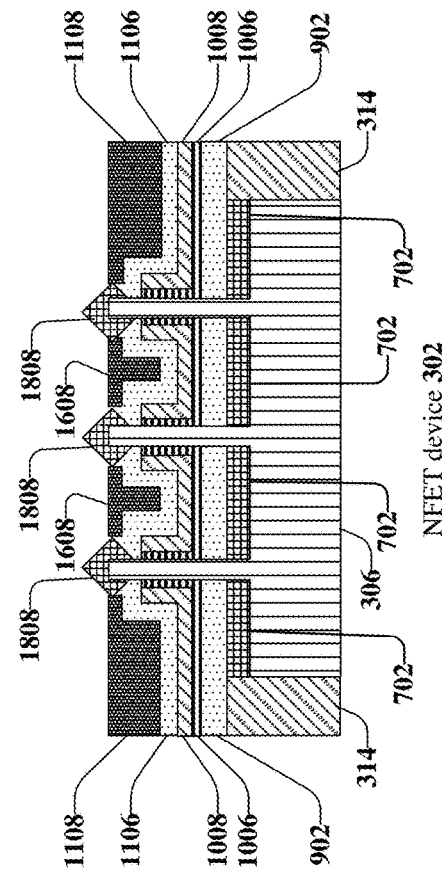
FIG. 18B illustrates a side cross-sectional view of the n-channel field effect transistor device of FIG. 18A in accordance with one or more embodiments described herein.
Figure 18C:
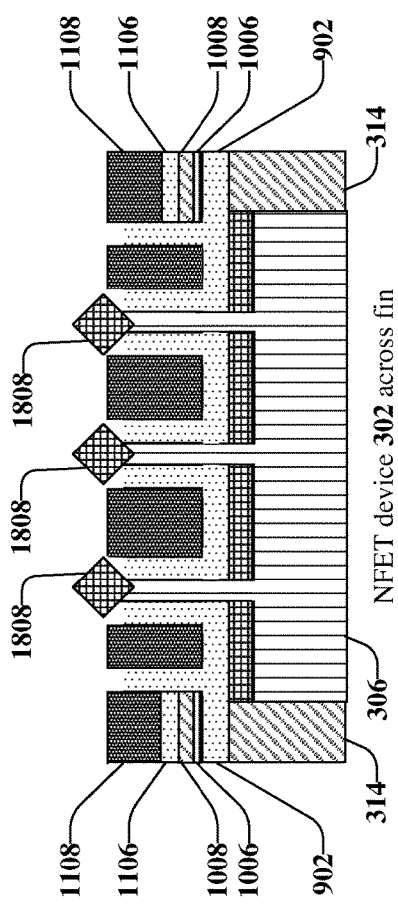
FIG. 18C illustrates another side cross-sectional view of the n-channel field effect transistor device of FIG. 18A in accordance with one or more embodiments described herein.
Figure 18D:
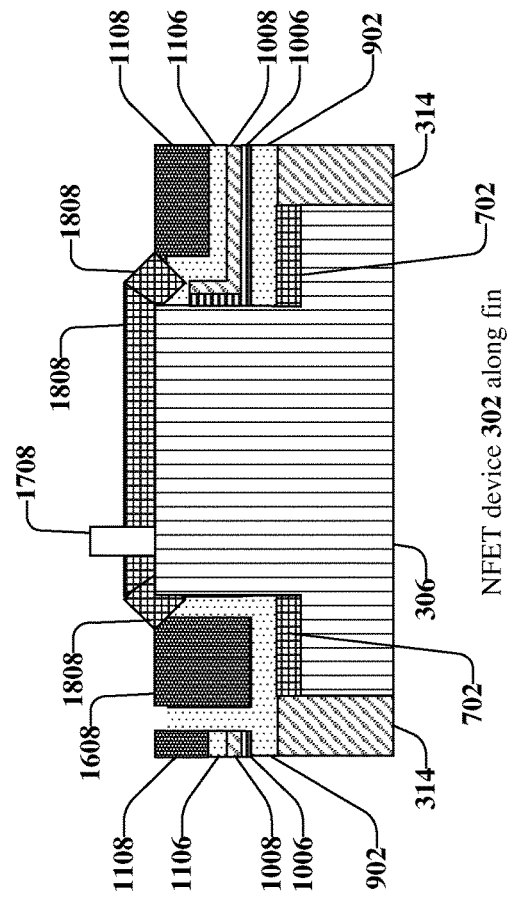
FIG. 18D illustrates a further side cross-sectional view of the n-channel field effect transistor device of FIG. 18A in accordance with one or more embodiments described herein.

FIG. 18A illustrates a top down view of the NFET device 302 during a portion of the fabrication process wherein an epitaxial layer (EPI) is grown in accordance with one or more embodiments described herein. FIG. 18B illustrates a side cross-sectional view of the NFET device 302 at line 1802 (X') of FIG. 18A in accordance with one or more embodiments described herein. FIG. 18C illustrates a side cross-sectional view of the NFET device 302 at line 1804 (e.g., X" or across the one or more fins) and FIG. 18D illustrates a side cross-sectional view of the NFET device at line 1806 (e.g., along the second fin 312₂) in accordance with one or more embodiments described herein. Repetitive description of like elements employed in other embodiments described herein is omitted for sake of brevity.

An epitaxial layer 1808 (e.g., the second epitaxial layer 116) can be grown on the NFET device 302 (or the PFET device 304). The epitaxial layer 1808 can be grown on top of the exposed silicon, in an implementation. As mentioned, the layer of silicon nitride 1708 can comprise the separation between the vertical FINFET device and the transistor structure. According to some implementations, the growth of the epitaxial layer can include block patterning for different EPIs.

Figure 19A:
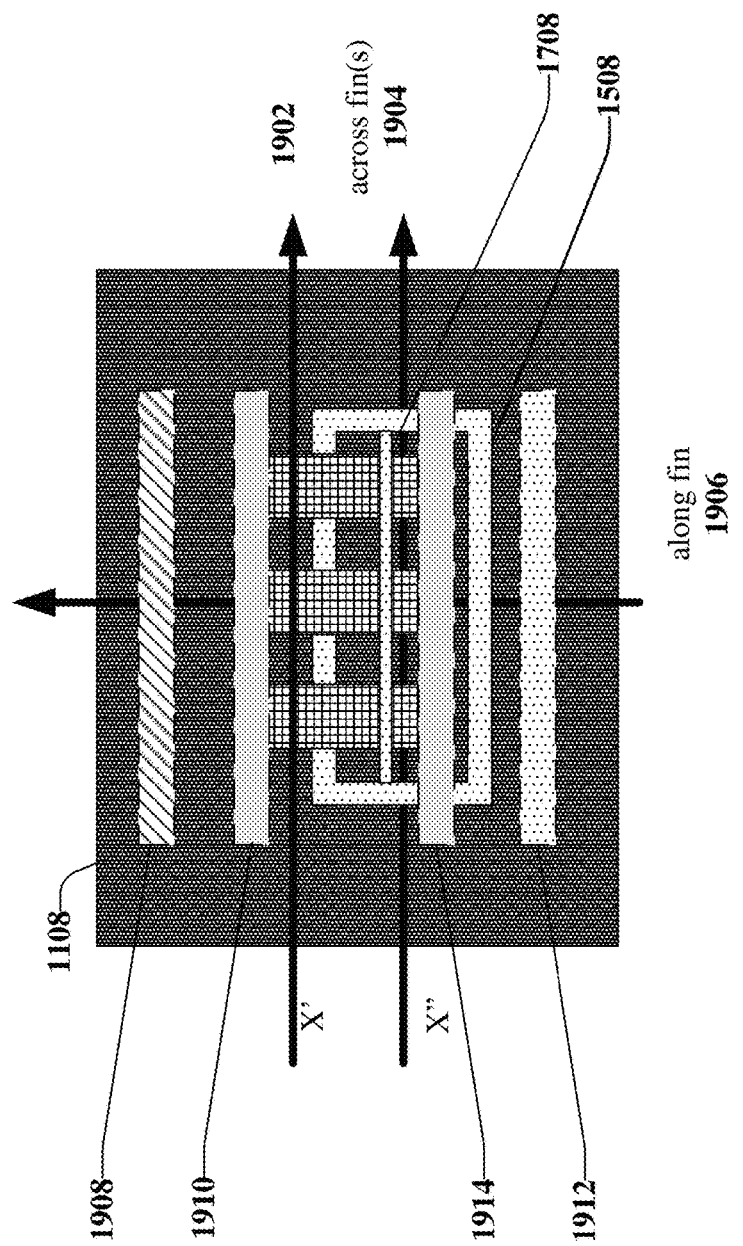
FIG. 19A illustrates a top down view of the n-channel field effect transistor device during a portion of the fabrication process wherein oxide deposition and metal contact is performed in accordance with one or more embodiments described herein.
Figure 19B:
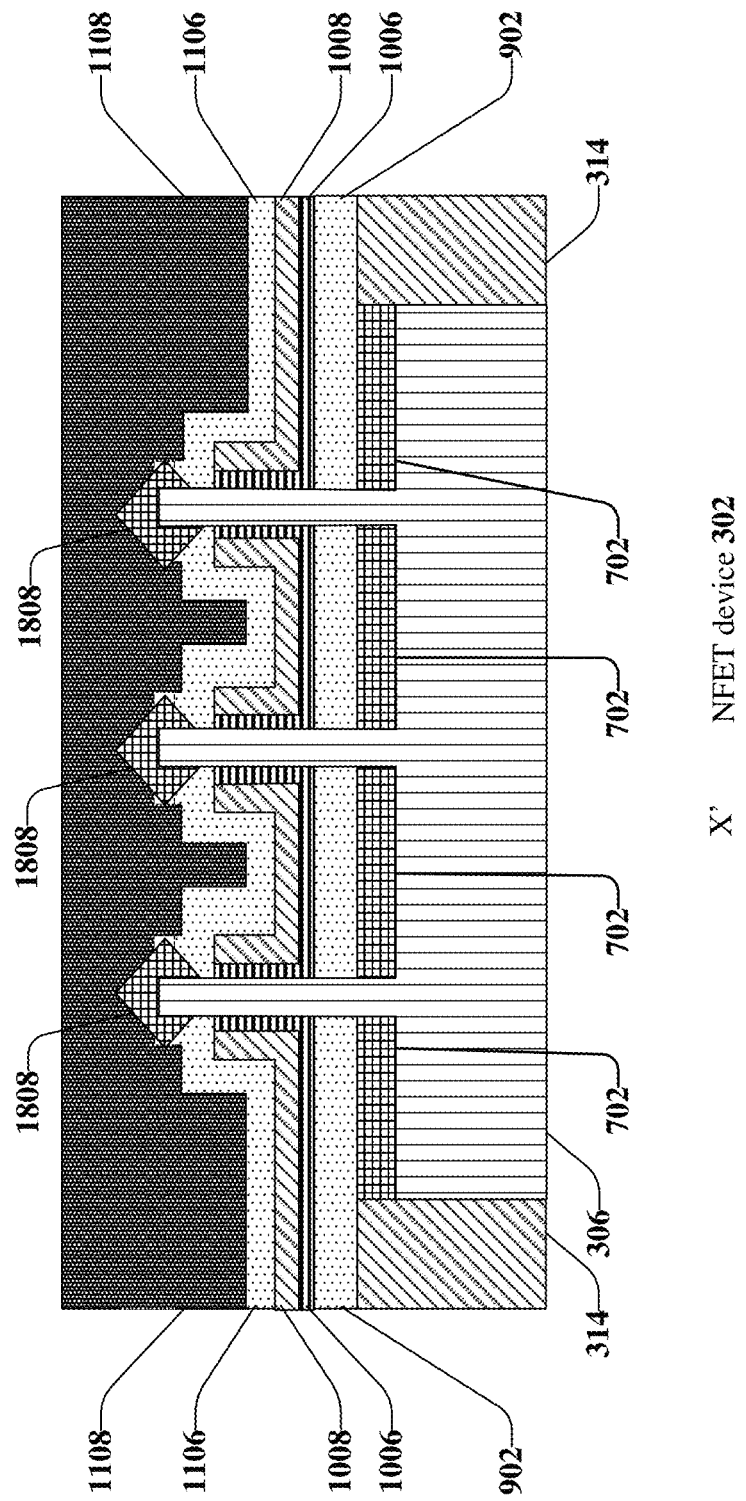
FIG. 19B illustrates a side cross-sectional view of the n-channel field effect transistor device of FIG. 19A in accordance with one or more embodiments described herein.
Figure 19C:
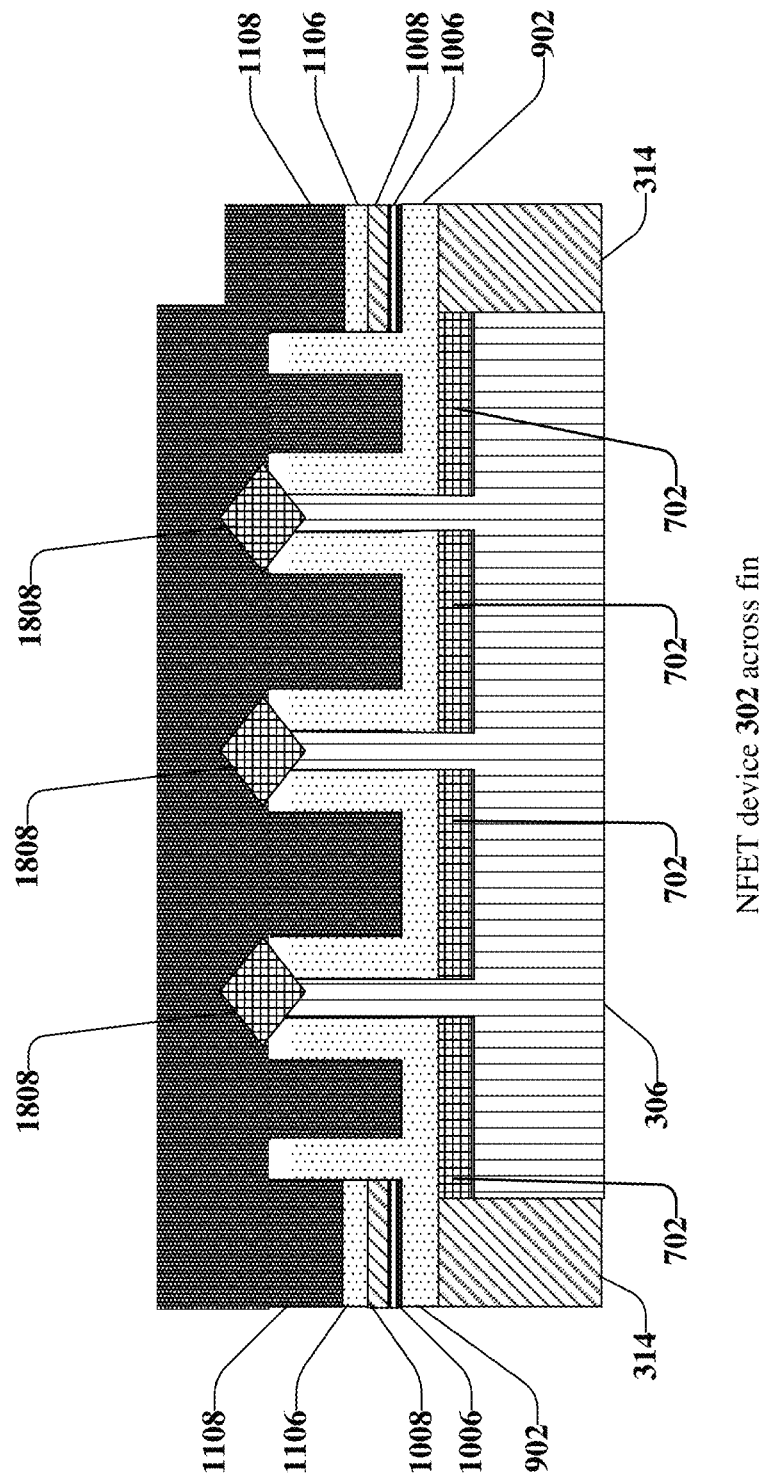
FIG. 19C illustrates another side cross-sectional view of the n-channel field effect transistor device of FIG. 19A in accordance with one or more embodiments described herein.
Figure 19D:
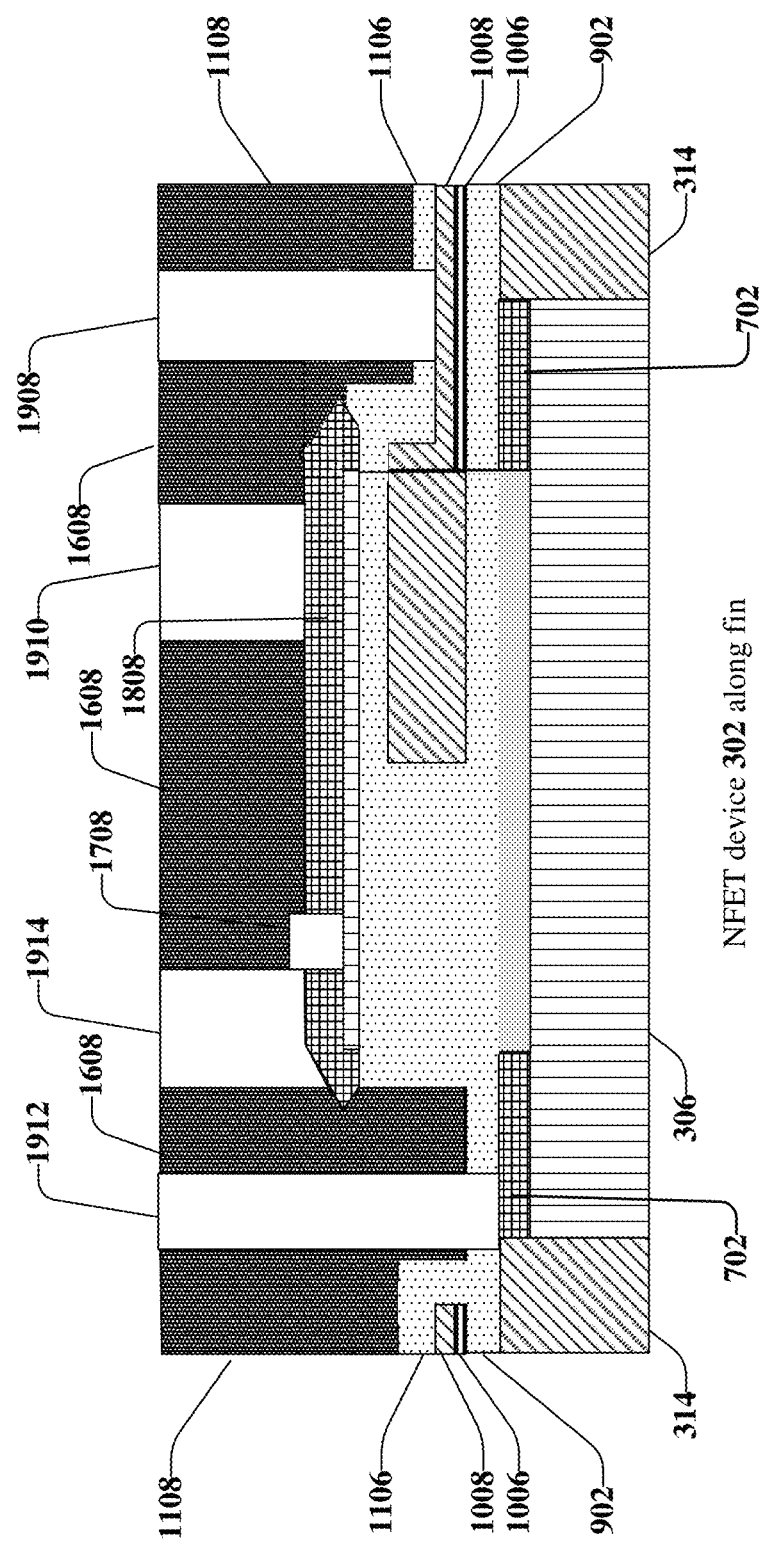
FIG. 19D illustrates a further side cross-sectional view of the n-channel field effect transistor device of FIG. 19A in accordance with one or more embodiments described herein.

FIG. 19A illustrates a top down view of the NFET device 302 during a portion of the fabrication process wherein oxide deposition and metal contact is performed in accordance with one or more embodiments described herein. FIG. 19B illustrates a side cross-sectional view of the NFET device 302 at line 1902 (X') of FIG. 19A in accordance with one or more embodiments described herein. FIG. 19C illustrates a side cross-sectional view of the NFET device 302 at line 1904 (e.g., X" or across the one or more fins) and FIG. 19D illustrates a side cross-sectional view of the NFET device at line 1906 (e.g., along the second fin 312₂) in accordance with one or more embodiments described herein. Repetitive description of like elements employed in other embodiments described herein is omitted for sake of brevity.

Illustrated are the opening of the contacts, which can comprise four contacts. The contacts can include, a gate contact 1908 (e.g., the fourth contact 130), a top source/drain contact 1910 (e.g., the third contact 128), a bottom source/drain Ti (titanium) contact 1912 (e.g., the first contact 122), and a Vbb-BJT contact 1914 (e.g., the second contact 126). The opening of the contacts can be best viewed in FIGS. 19A and 19D. As illustrated in FIG. 19A, the bottom contact is illustrated at the bottom of the figure and the top contact is illustrated at the top of the figure. As illustrated in FIG. 19D, the bottom contact is opened to the bottom EPI layer.

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 20:
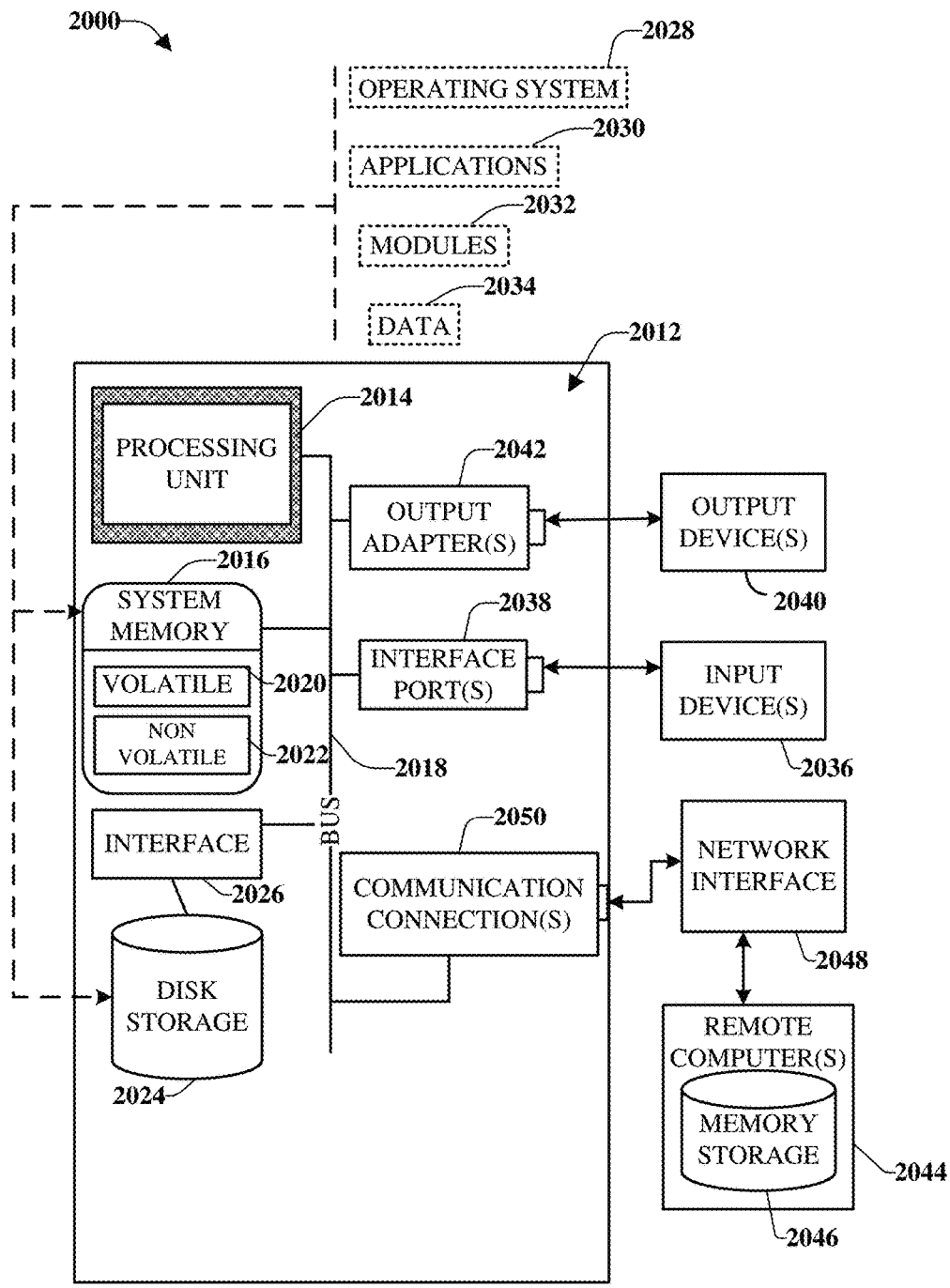
FIG. 20 illustrates a block diagram of an example, non-limiting operating environment in which one or more embodiments described herein can be facilitated.

In order to provide a context for the various aspects of the disclosed subject matter, FIG. 20 as well as the following discussion are intended to provide a general description of a suitable environment in which the various aspects of the disclosed subject matter can be implemented. FIG. 20 illustrates a block diagram of an example, non-limiting operating environment in which one or more embodiments described herein can be facilitated. Repetitive description of like elements employed in other embodiments described herein is omitted for sake of brevity. With reference to FIG. 20, a suitable operating environment 2000 for implementing various aspects of this invention can also include a computer 2012. The computer 2012 can also include a processing unit 2014, a system memory 2016, and a system bus 2018. The system bus 2018 couples system components including, but not limited to, the system memory 2016 to the processing unit 2014. The processing unit 2014 can be any of various available processors. Dual microprocessors and other multiprocessor architectures also can be employed as the processing unit 2014. The system bus 2018 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 2016 can also include volatile memory 2020 and nonvolatile memory 2022. The basic input/output system (BIOS), containing the basic routines to transfer information between elements within the computer 2012, such as during start-up, is stored in nonvolatile memory 2022. By way of illustration, and not limitation, nonvolatile memory 2022 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM)). Volatile memory 2020 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 2012 can also include removable/non-removable, volatile/non-volatile computer storage media. FIG. 20 illustrates, for example, a disk storage 2024. Disk storage 2024 can also include, but is not limited to, devices like a magnetic disk drive, floppy disk drive, tape drive, Jaz drive, Zip drive, LS-100 drive, flash memory card, or memory stick. The disk storage 2024 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 2024 to the system bus 2018, a removable or non-removable interface is typically used, such as interface 2026. FIG. 20 also depicts software that acts as an intermediary between users and the basic computer resources described in the suitable operating environment 2000. Such software can also include, for example, an operating system 2028. Operating system 2028, which can be stored on disk storage 2024, acts to control and allocate resources of the computer 2012. System applications 2030 take advantage of the management of resources by operating system 2028 through program modules 2032 and program data 2034, e.g., stored either in system memory 2016 or on disk storage 2024. It is to be appreciated that this invention can be implemented with various operating systems or combinations of operating systems. A user enters commands or information into the computer 2012 through input device(s) 2036. Input devices 2036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 2014 through the system bus 2018 via interface port(s) 2038. Interface port(s) 2038 include, for example, a serial port, a parallel port, a game port, and a universal serial bus (USB). Output device(s) 2040 use some of the same type of ports as input device(s) 2036. Thus, for example, a USB port can be used to provide input to computer 2012, and to output information from computer 2012 to an output device 2040. Output adapter 2042 is provided to illustrate that there are some output devices 2040 like monitors, speakers, and printers, among other output devices 2040, which require special adapters. The output adapters 2042 include, by way of illustration and not limitation, video and sound cards that provide a method of connection between the output device 2040 and the system bus 2018. It should be noted that other devices and/or systems of devices provide both input and output capabilities such as remote computer(s) 2044.

Computer 2012 can operate in a networked environment using logical connections to one or more remote computers, such as remote computer(s) 2044. The remote computer(s) 2044 can be a computer, a server, a router, a network PC, a workstation, a microprocessor based appliance, a peer device or other common network node and the like, and typically can also include many or all of the elements described relative to computer 2012. For purposes of brevity, only a memory storage device 2046 is illustrated with remote computer(s) 2044. Remote computer(s) 2044 is logically connected to computer 2012 through a network interface 2048 and then physically connected via communication connection 2050. Network interface 2048 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 2050 refers to the hardware/software employed to connect the network interface 2048 to the system bus 2018. While communication connection 2050 is shown for illustrative clarity inside computer 2012, it can also be external to computer 2012. The hardware/software for connection to the network interface 2048 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create method for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this invention also can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this invention can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other method to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this specification, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this invention, but one of ordinary skill in the art can recognize that many further combinations and permutations of this invention are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A logic device, comprising:
    a vertical field effect transistor comprising a substrate, a first epitaxial layer and a second epitaxial layer, wherein a bottom source/drain contact is between a first surface of the logic device and the first epitaxial layer, and a top source/drain contact is between the first surface and the second epitaxial layer at a respective first portion of one or more vertical fins; and
    a boosted bipolar junction transistor, wherein a bipolar junction transistor contact is between the first surface and the second epitaxial layer at a respective second portion of the one or more vertical fins, wherein the respective first portion and the respective second portion are opposite portions of the one or more vertical fins.

2. The logic device of claim 1, wherein the vertical field effect transistor is an n-channel field effect transistor.

3. The logic device of claim 1, wherein the vertical field effect transistor is a p-channel field effect transistor.

4. The logic device of claim 1, wherein the bipolar junction transistor contact provides a boosted voltage level for the logic device.

5. The logic device of claim 1, further comprising a self-aligned gate around the one or more vertical fins.

6. The logic device of claim 5, further comprising a gate contact between the first surface of the logic device and the self-aligned gate.

7. The logic device of claim 1, further comprising a spacer adjacent the second epitaxial layer, wherein the spacer separates the vertical field effect transistor and the boosted bipolar junction transistor.

8. The logic device of claim 1, wherein the substrate is a silicon substrate.

9. The logic device of claim 1, wherein the bottom source/drain contact is a titanium contact.

10. The logic device of claim 1 is configured to provide a slope and drive current boosting while maintaining a low-off-state current, wherein the slope is represented by a current-voltage characteristic of the logic device.

11. The logic device of claim 1 is a five-nanometer technology boosted vertical field effect transistor.

12. A method, comprising:
forming a vertical field effect transistor over a substrate, the vertical field effect transistor comprises a first epitaxial layer, a second epitaxial layer and one or more vertical fins;
forming a bottom source/drain contact between a first surface of the vertical field effect transistor and the first epitaxial layer, and a top source/drain contact between the first surface and the second epitaxial layer at a respective first portion of the one or more vertical fins;
forming a boosted bipolar junction transistor with the vertical field effect transistor; and
forming a bipolar junction transistor contact between the first surface and the second epitaxial layer at a respective second portion of the one or more vertical fins, wherein the respective first portion and the respective second portion are opposite portions of the one or more vertical fins.

13. The method of claim 12, wherein the forming the vertical field effect transistor comprises doping an active portion as an n-channel field effect transistor.

14. The method of claim 12, wherein the forming the vertical field effect transistor comprises doping an active portion as a p-channel field effect transistor.

15. The method of claim 12, further comprising forming a self-aligned gate around the one or more vertical fins.

16. The method of claim 15, further comprising forming a gate contact between the first surface and the self-aligned gate.

17. The method of claim 12, further comprising:
depositing a spacer adjacent the second epitaxial layer, wherein the spacer separates the vertical field effect transistor and the boosted bipolar junction transistor.

18. The method of claim 12, further comprises forming the vertical field effect transistor and the boosted bipolar junction transistor with five-nanometer technology.

19. A semiconductor device, comprising:
a vertical field effect transistor comprising a substrate, a first epitaxial layer, and a second epitaxial layer, wherein a bottom source/drain contact is between a first surface of the semiconductor device and the first epitaxial layer, and a top source/drain contact is between the first surface and the second epitaxial layer at a respective first portion of one or more vertical fins; and
a boosted bipolar junction transistor, wherein a bipolar junction transistor contact is between the first surface and the second epitaxial layer at a respective second portion of the one or more vertical fins, wherein the respective first portion and the respective second portion are opposite portions of the one or more vertical fins.

20. The semiconductor device of claim 19, wherein the substrate is a silicon substrate, and wherein the semiconductor device is configured to provide a slope and drive current boosting while maintaining a low-off-state current, wherein the slope is represented by a current-voltage characteristic of the semiconductor device.

* * * * *